(12) United States Patent
Ebihara et al.

(10) Patent No.: US 11,968,468 B2
(45) Date of Patent: Apr. 23, 2024

(54) CALIBRATION CIRCUIT FOR RAMP SETTLING ASSIST CIRCUIT IN LOCAL RAMP BUFFER CIRCUIT

(71) Applicant: OMNIVISION TECHNOLOGIES, INC., Santa Clara, CA (US)

(72) Inventors: Hiroaki Ebihara, San Jose, CA (US); Zhenfu Tian, San Jose, CA (US); Peter Bartkovjak, San Jose, CA (US); Satoshi Sakurai, Cupertino, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 210 days.

(21) Appl. No.: 17/659,045

(22) Filed: Apr. 13, 2022

(65) Prior Publication Data
US 2023/0336891 A1    Oct. 19, 2023

(51) Int. Cl.
| | | |
|---|---|---|
| *H04N 25/772* | (2023.01) | |
| *H03K 5/24* | (2006.01) | |
| *H03M 1/12* | (2006.01) | |
| *H03M 1/56* | (2006.01) | |
| *H04N 17/00* | (2006.01) | |
| *H04N 25/709* | (2023.01) | |
| *H04N 25/75* | (2023.01) | |

(52) U.S. Cl.
CPC .............. *H04N 25/772* (2023.01); *H03K 5/24* (2013.01); *H03M 1/1245* (2013.01); *H03M 1/56* (2013.01); *H04N 17/002* (2013.01); *H04N 25/709* (2023.01); *H04N 25/75* (2023.01)

(58) Field of Classification Search
CPC .. H04N 25/772; H04N 17/002; H04N 25/709; H04N 25/75; H04N 25/78; H03K 5/24; H03M 1/1245; H03M 1/56
See application file for complete search history.

(56) References Cited

U.S. PATENT DOCUMENTS

| | | |
|---|---|---|
| 9,571,775 B1 | 2/2017 | Zuo et al. |
| 10,498,993 B1 | 12/2019 | Ebihara et al. |
| 10,826,470 B2 | 11/2020 | Zuo et al. |
| 2016/0205333 A1* | 7/2016 | Shishido .............. H04N 25/677 348/308 |
| 2017/0237914 A1* | 8/2017 | Cho ....................... H04N 25/75 348/241 |
| 2018/0167573 A1 | 6/2018 | Zhu et al. |
| 2021/0084245 A1* | 3/2021 | Kim ....................... H04N 25/60 |
| 2022/0060647 A1 | 2/2022 | Lee et al. |

OTHER PUBLICATIONS

U.S. Appl. No. 17/217,950, filed Mar. 30, 2021 (37 pages).

* cited by examiner

*Primary Examiner* — Michael E Teitelbaum
(74) *Attorney, Agent, or Firm* — Perkins Coie LLP

(57) ABSTRACT

A ramp buffer circuit includes a ramp buffer input device having an input coupled to receive a ramp signal. A current monitor is circuit coupled to a power line and the ramp buffer input device to generate a current monitor signal in response to an input current conducted through the ramp buffer input device. A corner bias circuit is coupled to the current monitor circuit to generate an assist bias voltage in response to the current monitor signal. A bias current source is coupled to an output of the ramp buffer input device. An assist current source is coupled to the corner bias circuit and coupled between the output of the ramp buffer input device and ground to conduct an assist current from the output of the ramp buffer input device to ground in response to the assist bias voltage.

42 Claims, 10 Drawing Sheets

CALIBRATION CIRCUIT FOR RAMP SETTLING ASSIST CIRCUIT IN LOCAL RAMP BUFFER CIRCUIT

BACKGROUND INFORMATION

Field of the Disclosure

This disclosure relates generally to image sensors, and in particular but not exclusively, relates to a ramp generator in an image sensor.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which are read out as analog signals from the column bitlines and converted to digital values to produce digital images (i.e., image data) that represent the external scene.

Analog to digital converters (ADCs) are often used in CMOS image sensors (CIS) to convert the charge into a digital representation of the charge by the image sensor. The ADCs generate the digital representations of the charge based on a comparison of an image charge signal to a reference voltage signal. The reference voltage signal may conventionally be a ramp signal provided by a ramp generator and the comparison may conventionally be performed by a comparator, which provides an output that can be used with a counter to generate the digital representation of the image charge.

It is appreciated that the ramp settling time, or delay, of the ramp signal that is generated by the ramp generator and received by the comparator can limit the maximum frame rate of the image sensor. Thus, reducing the ramp settling time of the ramp signal that is received by the comparator can increase the maximum frame rate and therefore the performance of the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
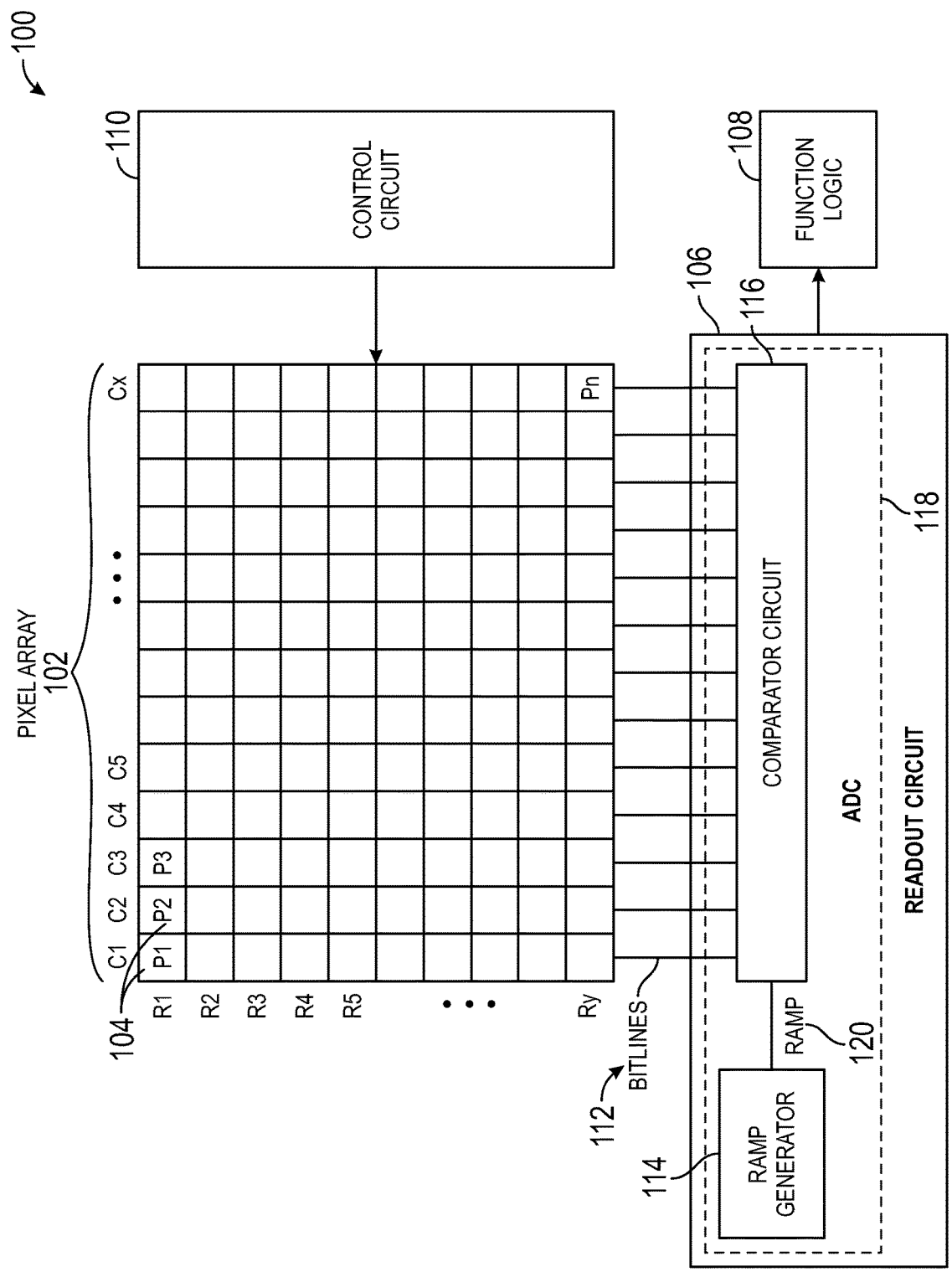
FIG. 1 illustrates one example of an imaging system including a circuit to calibrate a low power ramp settling assist circuit included in a local ramp buffer circuit in an analog to digital converter in a readout circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system with a circuit to calibrate ramp settling assist circuits included in local ramp buffer circuits included in a readout circuit are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a circuit to calibrate a low power ramp settling assist circuit included in a local ramp buffer circuit in an analog to digital converter in a readout circuit are described. In various examples, a ramp generator is configured to generate a system level ramp signal that is coupled to be received by the analog to digital converters included in the readout circuit. Each analog converter includes a comparator that is coupled to receive analog image data from a column bitline and the ramp signal through a local ramp buffer circuit. In the examples, a low power ramp settling assist circuit includes an assist current source that is included in each local ramp buffer and is coupled between the output of the local ramp buffer circuit and ground. In the examples, the low power ramp settling assist circuit provides an assist current from the output of the local ramp buffer circuit to ground that is switched on during a ramp event or a ramp phase of the output local ramp buffer circuit. For purposes of this disclosure, it is appreciated that a ramp event of the output ramp signal is the time during which the ramp signal decreases continuously. An output capacitor coupled to the output of the local ramp buffer circuit is discharged by assist current, which therefore reduces a ramp settling time of the ramp signal that is caused by loading of the output of the local ramp buffer circuit, which therefore improves the maximum frame rate and image sensor performance in accordance with the teachings of the present invention. In addition, a circuit to calibrate the low power ramp settling assist circuits is also included. In the various examples, a current monitor is included to monitor an input current through a ramp buffer input device of the local ramp buffer circuit. Various examples of corner bias circuits are coupled to the current monitor circuit to generate an assist bias voltage that is used to control the low power ramp settling assist circuit in the local ramp buffer circuit in accordance with the teachings of the present invention.

To illustrate, FIG. 1 shows one example of an imaging system 100 including a readout circuit including a low power ramp settling assist circuit included in a local ramp buffer circuits in an analog to digital converter in the readout circuit in accordance with the teachings of the present invention. In various examples, a circuit to calibrate the low power ramp settling assist circuit included in a local ramp buffer circuits is included in the readout circuit. As shown in the illustrated example, imaging system 100 includes a pixel array 102, a control circuit 110, a readout circuit 106, and function logic 108. In one example, pixel array 102 is a two-dimensional (2D) array including a plurality of pixel circuits 104 (e.g., P1, P2, . . . , Pn) that are arranged into rows (e.g., R1 to Ry) and columns (e.g., C1 to Cx) to acquire image data of a person, place, object, etc., which can then be used to render an image of a person, place, object, etc.

In various examples, each pixel circuit 104 may include one or more photodiodes configured to photogenerate image charge in response to incident light. The image charge generated in each photodiode is transferred to a floating diffusion included in each pixel circuit 104, which is converted to an image signal and then read out from each pixel circuit 104 by readout circuit 106 through column bitlines 112. In the various examples, readout circuit 106 may read out a row of image data at a time along readout column bitlines 112 (illustrated) or may read out the image data using a variety of other techniques (not illustrated), such as a serial readout or a full parallel readout of all pixel circuits 104 simultaneously.

In various examples, readout circuit 106 may include amplification circuitry, an analog to digital converter (ADC), or otherwise. In the depicted example, ADC 118 includes a comparator circuit 116 coupled to receive the image signals from pixel array 102 through the column bitlines 112. In one example, the comparator circuit 116 may include a plurality of comparators coupled to receive the image signals through the bitlines 112. In the example, each of the comparators included in comparator circuit 116 is also coupled to receive a ramp signal 140 from a ramp generator 114 as shown. In the various examples, each of the comparators is coupled to receive the ramp signal 140 through a local ramp buffer circuit. Each comparator included in comparator circuit 116 may be used to determine a digital representation of the image signal using a counter based on a comparison of ramp signal 140 to the image signal voltage level received through bitlines 112. As will be discussed, in the various examples, each local ramp buffer circuit includes a low power ramp settling assist circuit, which reduces the ramp settling time, or delay, of the ramp signal 140 to increase the maximum frame rate and therefore improve the performance of the imaging system 100. A circuit is also included in the readout circuit 106 to calibrate the low power ramp settling circuit included in each local ramp buffer circuit in accordance with the teachings of the present invention.

In the example, the digital image data values generated by ADC 118 may then be received by function logic 108. Function logic 108 may simply store the digital image data or even manipulate the digital image data by applying post image effects (e.g., crop, rotate, remove red eye, adjust brightness, adjust contrast, or otherwise).

In one example, control circuit 104 is coupled to pixel array 102 to control operation of the plurality of photodiodes in pixel array 102. For example, control circuit 104 may generate a shutter signal for controlling image acquisition. In one example, the shutter signal is a global shutter signal for simultaneously enabling all pixel circuits 104 within pixel array 102 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
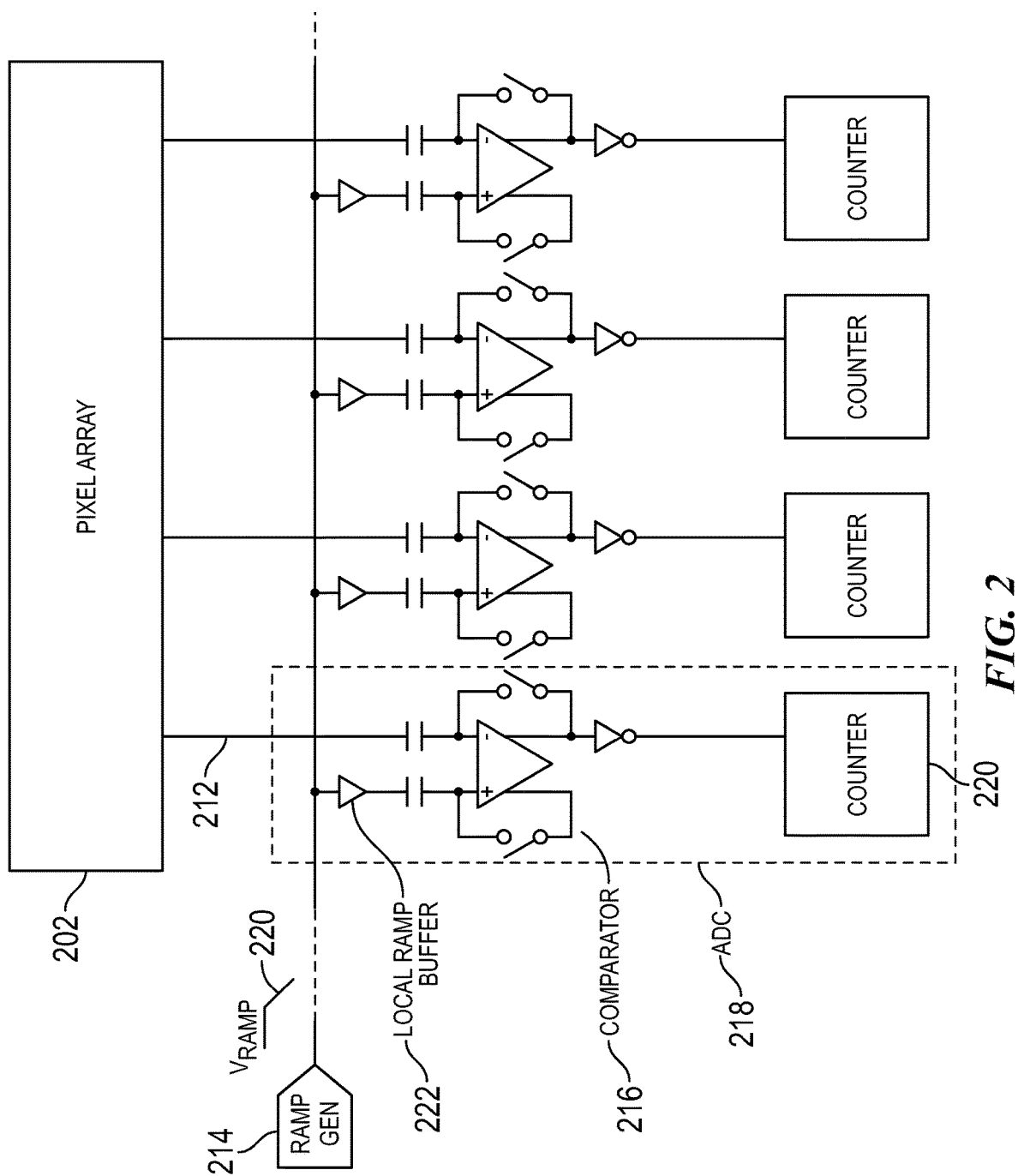
FIG. 2 is a block diagram illustrating example analog to digital converters coupled to receive a ramp signal from a ramp generator through local ramp buffers in accordance with the teachings of the present invention.

To illustrate, FIG. 2 shows a plurality of analog to digital converters (ADCs) 218 coupled to receive analog image data from pixel array 202 through respective bitlines 212. It is appreciated that each of the ADCs 218 illustrated in FIG. 2 are substantially similar to one another, and that only one of the ADCs 218 is labeled in FIG. 2 for the sake of brevity. As shown in the depicted example, a ramp generator 214 is configured to generate a system level ramp signal $V_{RAMP}$ 220. Each ADC 218 includes a comparator 216 having a first input (e.g., inverting input) coupled to receive the analog image data from pixel array 202 through bitline 212, and a second input coupled to receive the ramp signal $V_{RAMP}$ 220 through a local ramp buffer circuit 222. In operation, each comparator is configured to flip when the voltage of the ramp signal $V_{RAMP}$ 220 received by the comparator 216 through local ramp buffer circuit 222 reaches or is equal to the voltage of the analog image data received from the bitline 212. A counter 220 is coupled to the output of comparator 216 to provide a digital representation of the voltage of the analog image data received from the bitline 212 when the comparator 216 flips in response to a comparison of the ramp signal $V_{RAMP}$ 220 received through local ramp buffer circuit 222 and the voltage of the analog image data received from the bitline 212

Figure 3A:
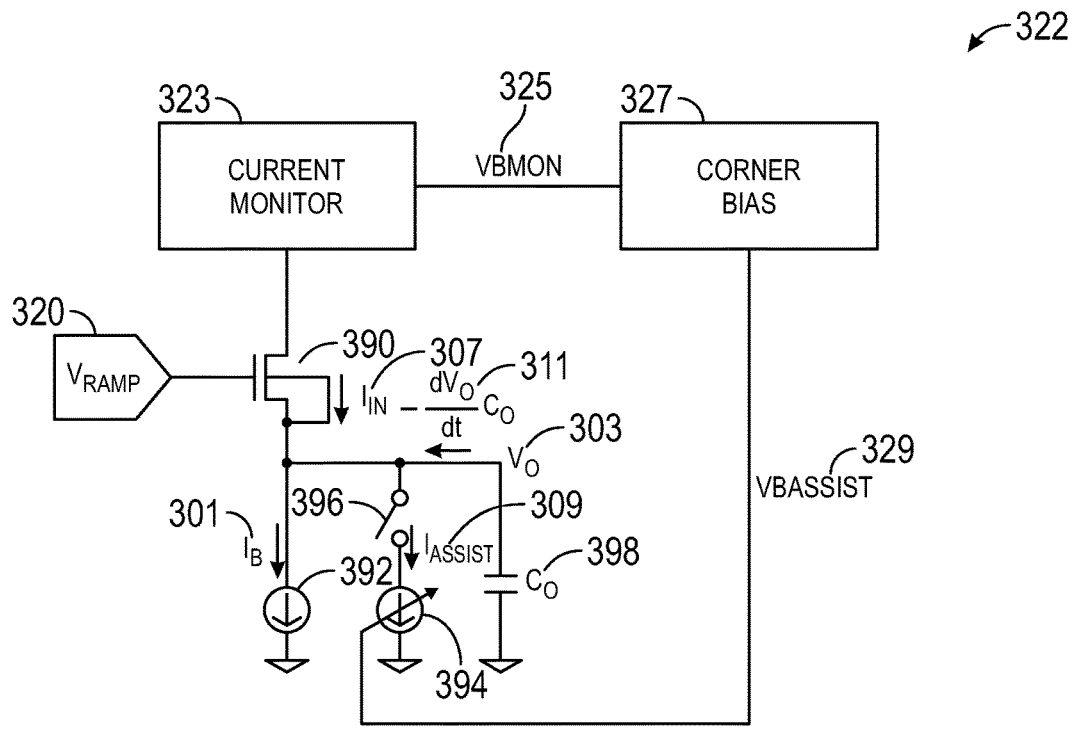
FIG. 3A shows one example of a schematic of a local ramp buffer circuit including a ramp settling assist circuit that is calibrated with an example current monitor circuit and an example corner bias circuit in accordance with the teachings of the present invention.

FIG. 3A shows one example of a schematic of a local ramp buffer circuit including a ramp settling assist circuit in accordance with the teachings of the present invention. It is appreciated that the local ramp buffer circuit illustrated in FIG. 3A may be an example local ramp buffer circuit illustrated in FIG. 2, and that similarly named and numbered elements described above are coupled and function similarly below.

As shown in the example depicted in FIG. 3A, a ramp buffer circuit 322 includes an input device 390 having an input coupled to receive a ramp signal $V_{RAMP}$ 320. In the depicted example, input device 390 is illustrated as an NMOS transistor having a drain coupled to a current monitor circuit 323, a gate coupled to receive the ramp signal $V_{RAMP}$ 320, and a source that is configured to be the output of the input device 390. A bias current source 392 is coupled to the output of the input device 390 such that the input device 390 and the bias current source 392 are coupled between the current monitor circuit 323 and ground. In operation, an input current $I_{IN}$ 307 is the drain source current of input device 390 that is configured to be conducted through input device 390 and a bias current $I_B$ 301 is configured to be conducted through bias current source 392.

In the depicted example, an output capacitor $C_O$ 398 or loading capacitor is coupled between the output of the input device 390 and ground. An assist current source 394 is also coupled between the output of the input device 390 and ground. As will be discussed, in the various examples, the assist current source 394 is a variable current source that is trimmed in response to an assist bias voltage VBASSIST 329 and is configured to conduct an assist current $I_{ASSIST}$ 309 from the output of the input device 390 to ground only during a ramp event generated in the ramp signal $V_{RAMP}$ 320. In the illustrated example, an assist current switch 396 is coupled to the assist current source 394 such that the assist current switch 396 and the assist current source 394 are coupled between the output of the input device 390 and ground. In various examples, the assist current switch 396 is configured to be turned on only during a ramp event generated in the ramp signal $V_{RAMP}$ 320 such that the assist current source 394 is configured to be activated to conduct the assist current $I_{ASSIST}$ 309 from the output of the input device 390 to ground only during the ramp event generated in the ramp signal $V_{RAMP}$ 320. In various examples, the assist current $I_{ASSIST}$ 309 conducted by the assist current source 394 during the ramp event generated in the ramp signal $V_{RAMP}$ 320 is substantially equal to a charging current of the output capacitor $C_O$ 398 coupled to the output of the input device 390 during the ramp event generated in the ramp signal $V_{RAMP}$ 320.

In various examples, the assist current switch 396 may be turned off to deactivate the assist current source 394 when a ramp event is not occurring in the ramp signal $V_{RAMP}$ 320 (e.g., prior to a ramp event or during a non-ramp event of ramp signal $V_{RAMP}$ 320). As such, the assist current switch 396 is turned off and the assist current $I_{ASSIST}$ 309 is zero during a non-ramp event of ramp signal $V_{RAMP}$ 320. At this time, it is also appreciated that the output capacitor $C_O$ 398 is not being charged or discharged and that the input current $I_{IN}$ 307 is substantially equal to the bias current $I_B$ 301.

In the various examples, the assist current switch 396 may be turned on to activate the assist current source 394 when a ramp event is occurring in the ramp signal $V_{RAMP}$ 320. As such, when the assist current source 394 is activated, the assist current $I_{ASSIST}$ 309 is conducted from the output of the input device 390 to ground through the assist current source 394. In the depicted example, during a ramp event in the ramp signal $V_{RAMP}$ 320, the output voltage $V_O$ 303 at the output of the input device 390 and across the output capacitor $C_O$ 398 follows the ramp signal $V_{RAMP}$ 320 and therefore decreases continuously with respect to time. As such, the output capacitor $C_O$ 398 is charged with a charging current 311 according to the following equation:

$$\text{Charging current} = -\frac{dV_O}{dt}C_O \quad (1)$$

In the various examples, the assist current $I_{ASSIST}$ 309 provided by the assist current source 394 is substantially equal in magnitude to the charging current 311 of the output capacitor $C_O$ 398 during the ramp event. Thus, the assist current $I_{ASSIST}$ 309 can also be determined according to the following equation:

$$I_{ASSIST} = -\frac{dV_O}{dt}C_O \quad (2)$$

As such, the bias current $I_B$ 301 of bias current source 392 does not need provide any of the charging current 311 for the output capacitor $C_O$ 398 during ramp events. Accordingly, the input current $I_{IN}$ 307 of the input device 390 remains substantially equal to the bias current $I_B$ 301 both during ramp events as well as prior to ramp events in accordance with the teachings of the present invention. In this way, the input current $I_{IN}$ 307 of the input device 390 remains substantially constant and not changed before, during, and after the ramp events and does not depend on the signal slope of the ramp signal $V_{RAMP}$ 320 or the loading capacitance of the output capacitor 398 in accordance with the teachings of the present invention.

In the various examples, the current monitor circuit 323 is configured to generate a current monitor signal VBMON 325 in response to the input current $I_{IN}$ 307 that is configured to be conducted from a power line through the input device 390. As shown in the depicted example, a corner bias circuit 327 is coupled to receive the current monitor signal VBMON 325 from the current monitor circuit 323 to generate the assist bias voltage VBASSIST 329 in response. The assist current source 394 is coupled to the corner bias circuit 327 to receive the assist bias voltage VBASSIST 329. In operation, the assist current $I_{ASSIST}$ 309 is generated by the assist current source 394 in response to the assist bias voltage VBASSIST 329 in accordance with the teachings of the present invention.

Figure 3B:
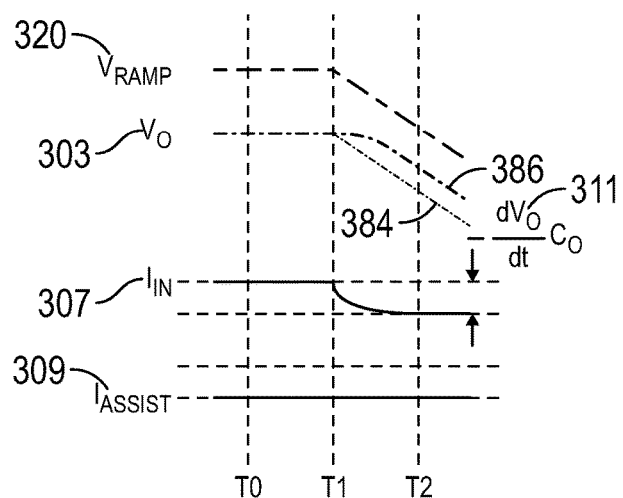
FIG. 3B is a timing diagram that illustrates signals in an example local ramp buffer circuit with a ramp settling assist circuit that is not activated during a ramp event in a ramp signal.

FIG. 3B is a timing diagram that illustrates signals in an example local ramp buffer circuit with a ramp settling assist circuit that is not activated during a ramp event in a ramp signal. It is appreciated that the signals illustrated in the timing diagram of FIG. 3B may be examples of signals found in the local ramp buffer circuit depicted in FIG. 3A without the assist current source 394 being activated, and that similarly named and numbered elements described above are coupled and function similarly below. In particular, the depicted example shows the ramp signal $V_{RAMP}$ 320, the output voltage signal $V_O$ 303, the input current $I_{IN}$ 307, and the assist current $I_{ASSIST}$ 309.

As shown in the example depicted in FIG. 3B, the ramp voltage signal $V_{RAMP}$ 320 and the output voltage $V_O$ 303 are both constant at time T0, which is prior to the ramp event, which occurs at time T1. During this non-ramp event period of time before time T1, the input current $I_{IN}$ 307 is equal to the bias current $I_B$ and the assist current $I_{ASSIST}$ 309 is equal to zero as the assist current source 394 is deactivated.

At time T1, the ramp event occurs in the ramp signal $V_{RAMP}$ 320, which can be seen with the voltage of ramp signal $V_{RAMP}$ 320 ramping down and decreasing continuously after time T1. The output voltage $V_O$ 303 follows the ramp signal $V_{RAMP}$ 320 and therefore also begins ramping down and decreasing continuously after time T1, which causes the output capacitor $C_O$ 398 to be charged with a charging current 311 having a magnitude of $-(dV_O/dt)*C_O$. For purposes of explanation, the example depicted in FIG. 3B shows that the assist current source 394 remains deactivated when the ramp event occurs in the ramp signal $V_{RAMP}$ 320 at time T1. As such, the assist current $I_{ASSIST}$ 309 remains zero at time T1. Since the assist current $I_{ASSIST}$ 309 remains zero at time T1, the $-(dV_O/dt)*C_O$ charging current 311 is provided by bias current source 392. Consequently, the input current $I_{IN}$ 307 through the input device 390 decreases by the $-(dV_O/dt)*C_O$ charging current 311 after time T1 and during the ramp event in the ramp signal $V_{RAMP}$ 320 as shown at time T2 in FIG. 3B. With the decrease in input current $I_{IN}$ 307 through the input device 390 at time T1, there is a ramp settling time delay that occurs in the output voltage $V_O$ 303 in order to charge the output capacitor $C_O$ 398, which causes the non-ideal ramp signal 386 instead of the ideal ramp signal 384 in the output voltage $V_O$ 303.

Figure 3C:
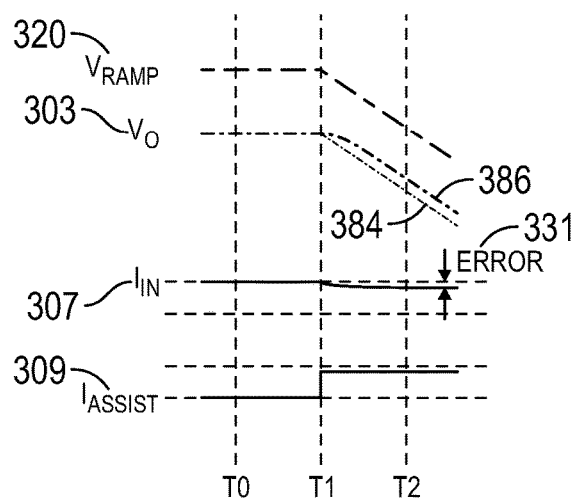
FIG. 3C is a timing diagram that illustrates signals in an example local ramp buffer circuit with a ramp settling assist circuit that is activated during a ramp event in a ramp signal in accordance with the teachings of the present invention.

FIG. 3C is a timing diagram that illustrates signals in an example local ramp buffer circuit with a ramp settling assist circuit that is activated during a ramp event in a ramp signal in accordance with the teachings of the present invention. It is appreciated that the signals illustrated in the timing diagram of FIG. 3C may be examples of signals found in the local ramp buffer circuit depicted in FIG. 3A. It is further appreciated that the signals illustrated in the timing diagram of FIG. 3C are the same as the signals illustrated in the timing diagram shown in FIG. 3B with the exception that the assist current source 394 being activated at time T1. Accordingly, it is appreciated that similarly named and numbered elements described above are coupled and function similarly below. In particular, the depicted example shows the ramp signal $V_{RAMP}$ 320, the output voltage signal $V_O$ 303, the input current $I_{IN}$ 307, and the assist current $I_{ASSIST}$ 309.

As shown in the example depicted in FIG. 3C, the ramp voltage signal $V_{RAMP}$ 320 and the output voltage $V_O$ 303 are both constant at time T0, which is prior to the ramp event, which occurs at time T1. During this non-ramp event period of time before time T1, the input current $I_{IN}$ 307 is equal to the bias current $I_B$ and the assist current $I_{ASSIST}$ 309 is equal to zero as the assist current source 394 is deactivated.

At time T1, the ramp event occurs in the ramp signal $V_{RAMP}$ 320, which can be seen with the voltage of ramp signal $V_{RAMP}$ 320 ramping down and decreasing continuously after time T1. The output voltage $V_O$ 303 follows the ramp signal $V_{RAMP}$ 320 and therefore also begins ramping down and decreasing continuously after time T1, which causes the output capacitor $C_O$ 398 to be charged with a charging current 311 having a magnitude of $-(dV_O/dt)*C_O$.

In the example depicted in FIG. 3C, the assist current source 394 is activated at time T1 when the ramp event occurs in the ramp signal $V_{RAMP}$ 320 at time T1. As such, the assist current $I_{ASSIST}$ 309 transitions from zero to a magnitude substantially equal to the $-(dV_O/dt)*C_O$ charging current 311 of the output capacitor $C_O$ 398. As such, the input current $I_{IN}$ 307 remains substantially unchanged during after time T1 and during the ramp event in the ramp signal $V_{RAMP}$ 320 as shown at time T2 in FIG. 3C. In the depicted example, a minor error 331 is illustrated in the input current $I_{IN}$ 307, which is a significant improvement compared to the example depicted in FIG. 3B. As such, with only the minor decrease in input current $I_{IN}$ 307 as shown with the minor error 331, there is only a minor a ramp settling time delay that occurs in the output voltage $V_O$ 303 in order to charge the output capacitor $C_O$ 398, which results in the significantly improved non-ideal ramp signal 386 compared to the ideal ramp signal 384 in the output voltage $V_O$ 303 in the example depicted in FIG. 3C.

Figure 4:
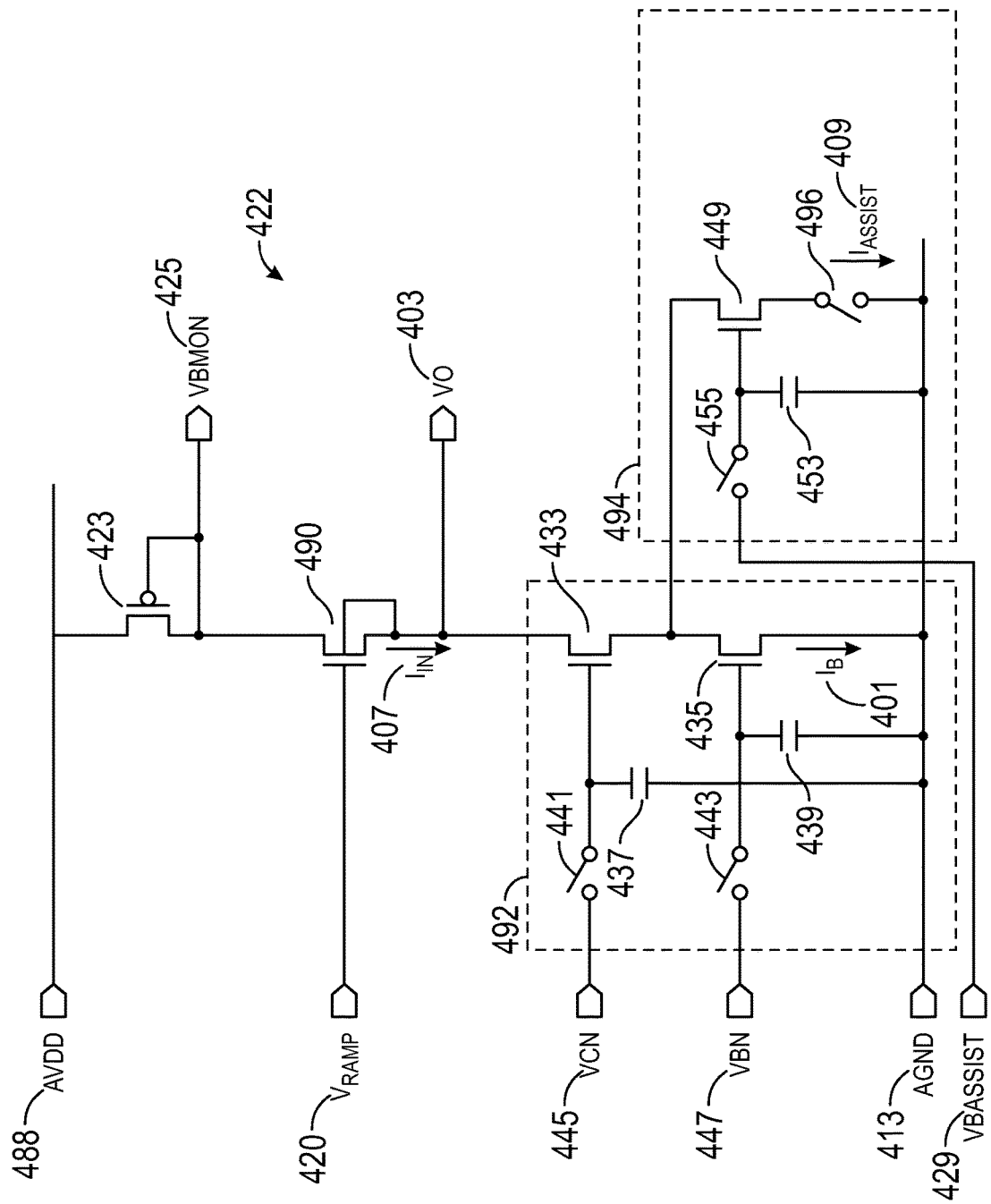
FIG. 4 shows a schematic of an example local ramp buffer circuit including an example ramp settling assist circuit in accordance with the teachings of the present invention.

FIG. 4 shows a schematic of an example local ramp buffer circuit including an example ramp settling assist circuit in accordance with the teachings of the present invention. It is appreciated that the local ramp buffer circuit illustrated in FIG. 4 may be an example local ramp buffer circuit illustrated in FIG. 3A or an example of the local ramp buffer circuit illustrated in FIG. 2, and that similarly named and numbered elements described above are coupled and function similarly below.

The example depicted in FIG. 4 shows a current monitor circuit 423 coupled between a power line 488 (e.g., AVDD) and an input device 490 of a ramp buffer circuit 422. In the depicted example, the current monitor circuit 423 is configured to generate a current monitor signal VBMON 425 in response to an input current $I_{IN}$ 407 that is conducted through the input device 490. As shown in the example depicted in FIG. 4, current monitor circuit 423 is illustrated as a PMOS transistor having a source coupled to the power line 488 and a gate and drain that are coupled together to generate the current monitor signal VBMON 425 in response to the input current that is conducted through the input device 490. The input device 490 is illustrated as an NMOS transistor having a drain coupled to a current monitor circuit 423, a gate coupled to receive the ramp signal $V_{RAMP}$ 420, and a source that is configured to be the output of the input device 490 to generate the output voltage $V_O$ 403, which follows the ramp signal $V_{RAMP}$ 420.

In the illustrated example, a bias current source 492 is coupled to the output of the input device 490 such that the input device 490 and the bias current source 492 are coupled between the current monitor circuit 423 and ground AGND 413. In operation, an input current $I_{IN}$ 407 is the drain source current of input device 390 that is configured to be conducted through input device 490 and a bias current $I_B$ 401 is configured to be conducted through bias current source 492. In the depicted example, bias current source 492 is shown as including cascode coupled transistors 433 and 435, which are coupled between the input device 490 and ground AGND 423. In one example, the bias current source 492 includes a capacitor 437 and switch 441 to sample and hold the bias voltage VCN 445 for transistor 433, and a capacitor 439 and switch 443 to sample and hold the bias voltage VBN 445 for transistor 435 as shown.

The example depicted in FIG. 4 also illustrates assist current source 494 coupled to provide assist current $I_{ASSIST}$ 409 from the output of the output of input device 490 as shown. In the depicted example, assist current source 494 is illustrated as including transistor 449 and assist current switch 496 coupled between the output of input device 490. In operation, the assist current switch 496 may be turned on to activate the assist current 494 and may be turned off to deactivate assist current source 494. In the example shown in FIG. 4, the transistor 449 is coupled to the output of input device 490 through transistor 433. In another example, it is appreciated that the transistor 449 can be coupled to the output "$V_O$" 403 directly not through transistor 433. As shown in the example, the gate of transistor 449 is coupled to be biased with assist bias voltage VBASSIST 429 to trim the assist current $I_{ASSIST}$ 409 in accordance with the teachings of the present invention. In one example, assist current source 494 includes a capacitor 453 and a switch 455 to sample and hold the assist bias voltage VBASSIST 429 at the gate of transistor 449 as shown.

Figure 5:
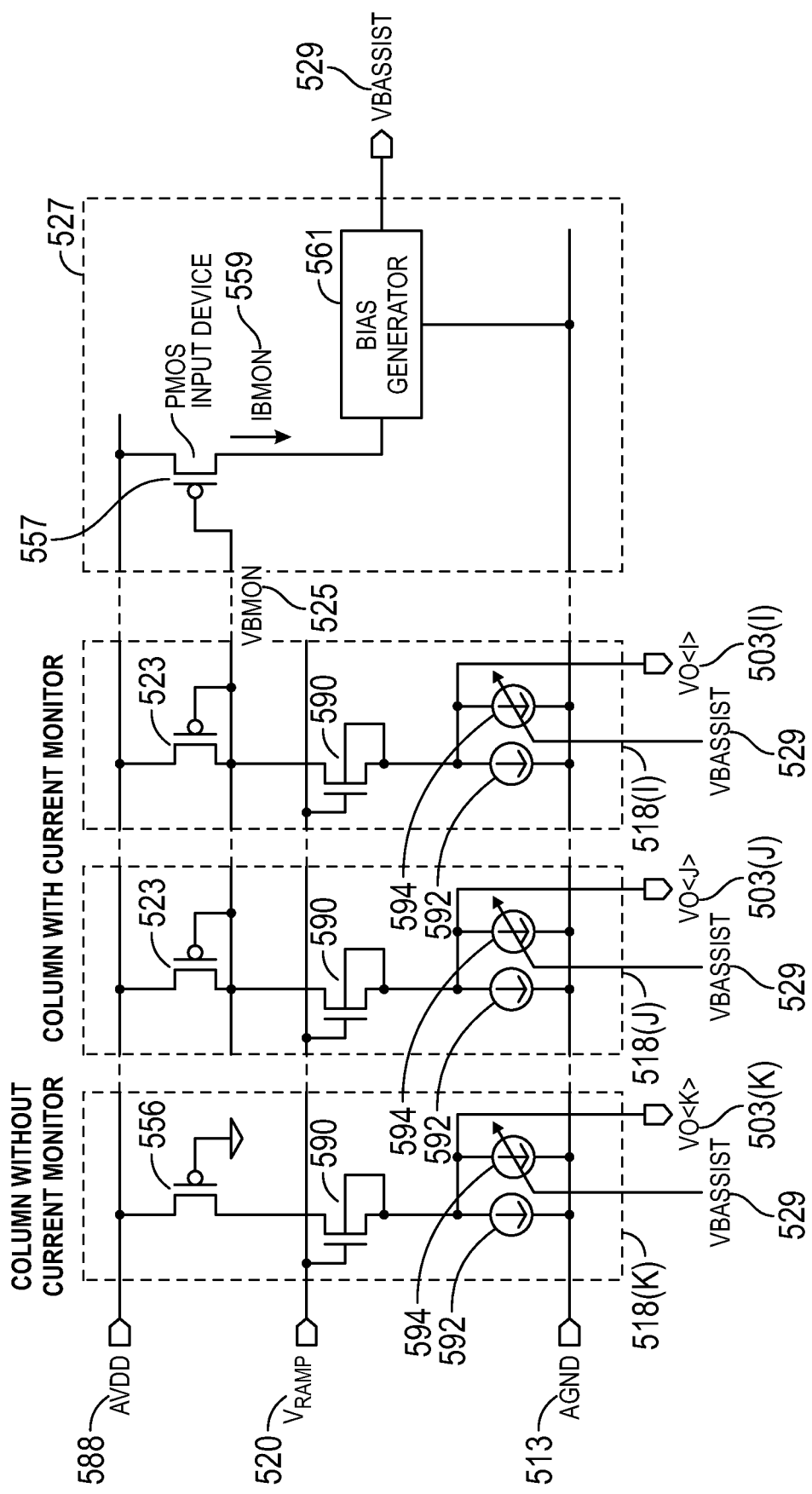
FIG. 5 shows a schematic of an example plurality of local ramp buffer circuits including ramp settling assist circuits with examples of current monitor circuits and an example corner bias circuit to calibrate the ramp settling circuits in accordance with the teachings of the present invention.

FIG. 5 shows a schematic of an example plurality of local ramp buffer circuits including ramp settling assist circuits with examples of current monitor circuits and an example corner bias circuit to calibrate the ramp settling circuits in accordance with the teachings of the present invention. It is appreciated that the local ramp buffer circuits, ramp settling circuits, current monitor circuit, and corner bias circuit illustrated in FIG. 5 may be examples of local ramp buffer circuits, ramp settling circuits, current monitor circuit, and corner bias circuit illustrated in FIG. 3A, or examples of the local ramp buffer circuit illustrated in FIG. 2, and that similarly named and numbered elements described above are coupled and function similarly below.

The example depicted in FIG. 5 shows a local ramp buffer circuits included in a plurality of columns of circuits coupled to readout a pixel array. The depicted example shows the local ramp buffer circuits included in portions of a plurality of ADCs 518(k), 518(j), and 518(i). In the depicted example, ADC 518(j) and ADC 518(i) include current monitor circuits 523 coupled to power line 588 (e.g., AVDD). In the example, ADC 518(k) does not include a current monitor circuit and instead includes a transistor 556 coupled to power line 588. In the example, the gate of transistor 556 is coupled to ground, while the gates and drains of the transistors included in current monitor circuits 523 are coupled together to generate a current monitor signal VBMON 525 as shown.

The local ramp buffer circuits of ADCs 518(k), 518(j), and 518(i) each include input devices 590, which are shown as including transistors having gates coupled to receive the ramp signal $V_{RAMP}$ 520, drains coupled to the power line 588 through transistor 556 or the current monitor circuits 523, and sources coupled to generate the output voltages $V_O$ 503(k), $V_O$ 503(j), and $V_O$ 503(i), respectively, as shown. In the example, each of the respective output voltages $V_O$ 503(k), $V_O$ 503(j), and $V_O$ 503(i) follow the ramp signal $V_{RAMP}$ 520.

In the depicted example, each of the local ramp buffer circuits include a bias current source 592 coupled between a respective input device 590 and ground AGND 513. The depicted example also illustrates that each of the local ramp buffer circuits include an assist current source 592 coupled between a respective input device 590 and ground AGND 513. Each assist current source 592 is coupled to receive an assist bias voltage VBASSIST 529 from a corner bias circuit 527 to trim the respective assist current that is configured to be conducted from the output of respective input device 590 and ground AGND 513.

In the example depicted in FIG. 5, corner bias circuit 527 is illustrated as receiving the current monitor signal VBMON 525 from the columns that include current monitor circuits 523 as shown. As mentioned, in some examples, not all of the columns include a current monitor circuit 523. In the illustrated example, corner bias circuit 527 is illustrated as including a corner bias input device 557 having an input coupled to receive the current monitor signal VBMON 525. The example illustrated in FIG. 5 illustrates corner bias input device 557 as a transistor having a source coupled to power line 588, a gate coupled to receive the current monitor signal VBMON 525, and a drain coupled to generate a corner bias monitor current IBMON 559 in response to the current monitor signal VBMON 525. In the example, a bias generator 561 is configured to generate the assist bias voltage VBASSIST 529 in response to the corner bias monitor current IBMON 559. In the various examples, the assist bias voltage VBASSIST 529 is configured to trim the assist current sources 594 of the local ramp buffer circuits in accordance with the teachings of the present invention.

Figure 6:
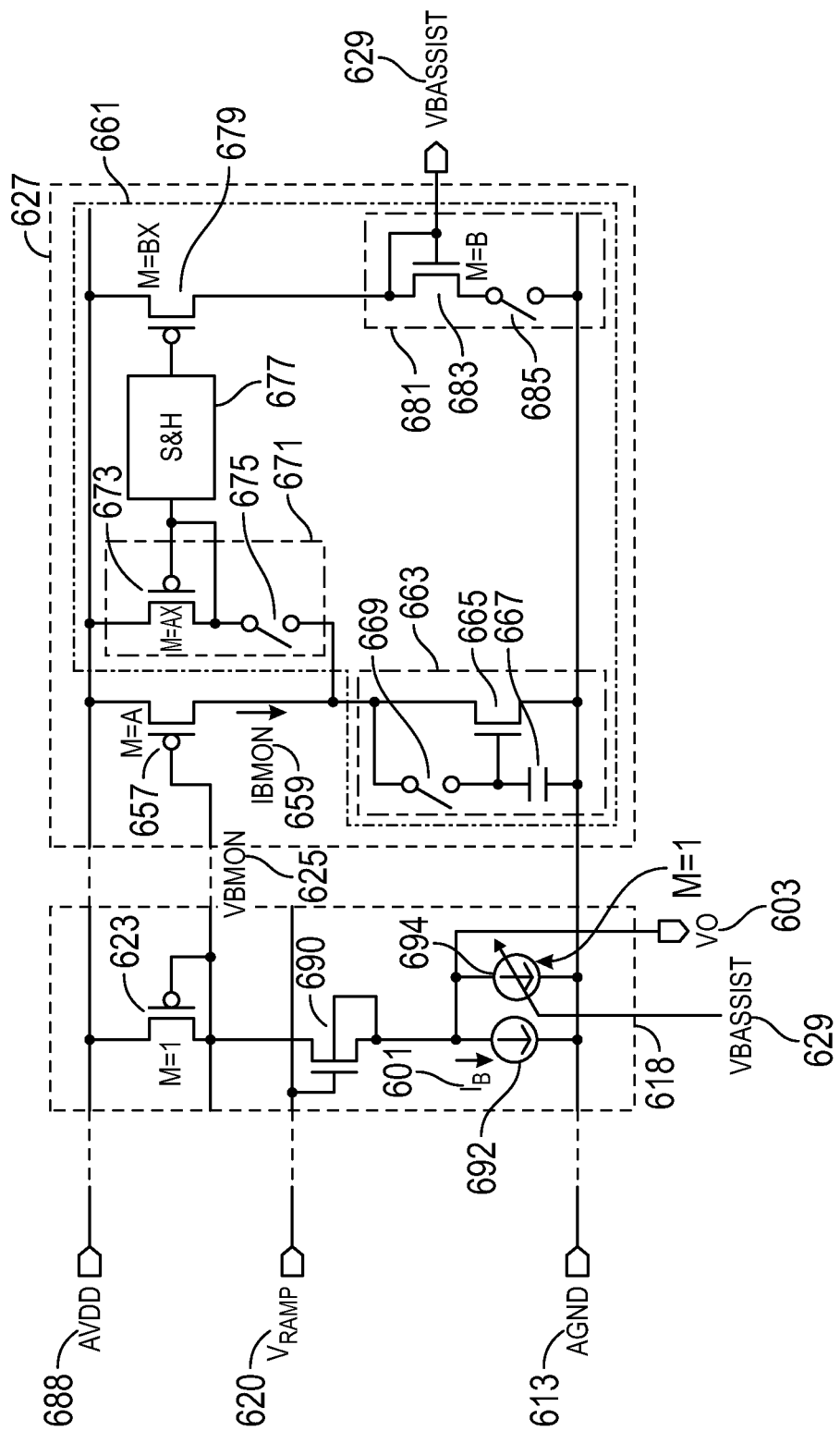
FIG. 6 shows a schematic of an example local ramp buffer circuit including ramp settling assist circuits with an example current monitor circuit and another example corner bias circuit to calibrate the ramp settling circuit in accordance with the teachings of the present invention.

FIG. 6 shows a schematic of an example local ramp buffer circuit including ramp settling assist circuits with an example current monitor circuit and another example corner bias circuit to calibrate the ramp settling circuit in accordance with the teachings of the present invention. It is appreciated that the local ramp buffer circuit, ramp settling circuit, current monitor circuit, and corner bias circuit illustrated in FIG. 6 may be an example of the local ramp buffer circuits, ramp settling circuits, current monitor circuit, and corner bias circuit illustrated in FIG. 5, or examples of local ramp buffer circuits, ramp settling circuits, current monitor circuit, and corner bias circuit illustrated in FIG. 3A, or examples of the local ramp buffer circuit illustrated in FIG. 2, and that similarly named and numbered elements described above are coupled and function similarly below.

The example depicted in FIG. 6 shows a local ramp buffer circuit that is included in a portion of an ADC 618. In the depicted example, ADC 618 includes current monitor circuit 623 coupled to power line 688 (e.g., AVDD). In the example, current monitor circuit 623 is illustrated as a transistor having a source coupled to the power line 688 and a gate and a drain that are coupled together to generate a current monitor signal VBMON 625 as shown. The local ramp buffer circuit includes an input device 690, which is shown as including a transistor having a gate coupled to receive the ramp signal $V_{RAMP}$ 620, a drain coupled to the power line 688 through current monitor circuit 623, and a source coupled to generate the output voltage $V_O$ 603 as shown. In the example, the output voltage $V_O$ 603 follows the ramp signal $V_{RAMP}$ 620.

In the depicted example, a bias current source 692 is coupled between input device 690 and ground AGND 613 to conduct a bias current $I_B$ 601. The depicted example also illustrates that an assist current source 694 is coupled between input device 690 and ground AGND 613. In the example, assist current source 694 is coupled to receive an assist bias voltage VBASSIST 629 from a corner bias circuit 627 to trim the assist current that is configured to be conducted from the output of respective input device 690 to ground AGND 613.

In the example depicted in FIG. 6, corner bias circuit 627 is illustrated as receiving the current monitor signal VBMON 625 from current monitor circuit 623 as shown. In the illustrated example, corner bias circuit 627 is illustrated as including a corner bias input device 657 having an input coupled to receive the current monitor signal VBMON 625. The example illustrated in FIG. 6 illustrates corner bias input device 657 as a transistor having a source coupled to power line 688, a gate coupled to receive the current monitor signal VBMON 625, and a drain coupled to generate a corner bias monitor current IBMON 659 in response to the current monitor signal VBMON 625.

In the example, a bias generator 661 is configured to generate the assist bias voltage VBASSIST 629 in response to the corner bias monitor current IBMON 659 received from corner bias input device 657. In the various examples, the assist bias voltage VBASSIST 629 generated by bias generator 661 of corner bias circuit 627 is configured to trim the assist current source 694 in accordance with the teachings of the present invention.

In the example depicted in FIG. 6, bias generator 661 includes a first bias generator current source 663 coupled to the corner bias input device 657. The corner bias input device 657 and the first bias generator current source 663 are coupled between the power line 688 and ground AGND 613. A current to voltage converter 671 is coupled to the corner bias input device 657 and the first bias generator current source 663. A second bias generator current source 679 is coupled to the current to voltage converter 671. In the example depicted in FIG. 6, a sample and hold circuit 677 is coupled between the current to voltage converter 671 and second bias generator current source 679. The example depicted in FIG. 6 also illustrates that a replica assist current source 681 is coupled to the second bias generator current source 679 as shown.

In the depicted example, the first bias generator current source 663 includes a first bias generator transistor 665 coupled between the corner bias input device 657 and ground AGND 613. In the example, a sample and hold circuit is provided with a first bias generator switch 669 is coupled between a drain and a gate of the first bias generator transistor 665 and a first bias generator capacitor 667 coupled between the gate of the first bias generator transistor 665 and ground AGND 613. In operation, the first bias generator switch 669 and the first bias generator capacitor 667 are configured to sample the gate voltage of the transistor 665 when the first bias generator switch 669 and hold the voltage while the first bias generator switch 669 is off. In this way, the corner bias monitor current IBMON 659 received by the first bias generator current source 663 can be sampled and held.

The illustrated example shows that the current to voltage converter 671 includes a current to voltage transistor 673 coupled to the power line 688 and a current to voltage switch 675 coupled between the current to voltage transistor 673 and the first bias generator current source 663. A gate and a drain of the current to voltage transistor 673 are coupled to the current to voltage switch 675. An output voltage of the current to voltage converter 671 is generated at the gate and drain of the current to voltage transistor 673. The gate and the drain of the current to voltage transistor 673 are configured to generate output voltage of the current to voltage converter 671 depending on the corner bias monitor current IBMON 659 when the current to voltage switch 675 is on.

In the example, the sample and hold circuit 677 coupled to receive the output voltage of the current to voltage converter 671, which is coupled to be received by a gate of a transistor included in the second bias generator current source 679. A source of the transistor included in the second bias generator current source 679 is coupled to the power line 688 and a drain of the transistor included in the second bias generator current source 679 is coupled to the replica assist current source 681. The second bias generator current source 679 outputs a current based on the voltage held by the sample and hold circuit 677.

In the example, the replica assist current source 681 includes a replica assist transistor 683 having a gate and drain that are coupled together and coupled to the second bias generator current source 679. A replica assist switch 685 is coupled to the replica assist transistor 683 such that the replica assist transistor 683 and the replica assist switch 685 are coupled between the second bias generator current source 679 and ground AGND 613. In the example, the assist bias voltage VBASSIST 629 is configured to be generated at the gate and drain of the replica assist transistor 683 as shown in response to the current from the second bias generator current source 679.

In one example, it is appreciated that the relative widths of the transistor of current monitor circuit 623 and the transistor of assist current source 694 are equal. For instance, in one example, assuming the width of the transistor of current monitor circuit 623 is m=1, the width of the transistor of corner bias input device 657 is also m=1. In one example, the width of the transistor of corner bias input device 657 is m=a, the width of transistor 673 is m=ax, the width of transistor 683 is m=b, and the width of the transistor of second bias generator current source 679 is m=bx. The replica assist current source 681 is configured to generate a current that is proportional to the ideal assist current $-(dV_O/dt)*C_O$ internally to generate the assist bias voltage VBASSIST 629. To further illustrate operation of the example depicted in FIG. 6, the timing diagram depicted in FIG. 3C is also referred to below.

At time T0 before the ramp event, which begins at time T1, the corner bias input device 657 outputs current $a*I_B$, which is proportional to the bias current $I_B$ 601. During this period at time T0 before the ramp event that begins at time T1, the current to voltage switch 675 in the current to voltage converter 671 is off and so no current goes to the I current to voltage converter 671 at this time.

Before time T0, the first bias generator switch 669 in the first bias generator current source 663 is on to short the drain and gate of the first bias generator transistor 665 in the first bias generator current source 663 and so the first bias generator current source 663 draws $a*I_B$, which is the same current as the corner bias monitor current IBMON 659 from the corner bias input device 657. Then at time T0, the first bias generator switch 669 in the first bias generator current source 663 turns off to sample and hold the gate voltage of the first bias generator transistor 665 at that moment. In this way, the first bias generator current source 663 is set to draw $a*I_B$, which is the corner bias monitor current IBMON 659. After the first bias generator current source 663 is set, the current to voltage switch 675 in the current to voltage converter 671 is turned on.

At time T2 or after time T1, which is during the ramp event while the ramp signal $V_{RAMP}$ 620 is ramping down or decreasing continuously, the output current of the corner bias input device 657 changes to $a*(I_B-(-dV_O/dt*C_O))$, which follows the current monitored by the current monitor circuit 623. Since the first bias generator current source 663 draws $a*I_B$ (during calibration now, assist current source 694 is disabled), the current that flows from the current to voltage converter 671 (a current shunt) becomes $-a*(dV_O/dt*C_O)$, which is proportional to the ideal assist current $I_{ASSIST}$. As such, the current to voltage converter 671 generates the voltage associated with the current $-a*(dV_O/dt*C_O)$.

At time T2, the sample and hold circuit 677 samples and holds the voltage generated by the current to voltage converter 671 and the second bias generator current source 679 generate a current which is proportional to $-b*(dV_O/dt*C_O)$. Accordingly, the replica assist current source 681 generates the assist bias voltage VBASSIST 629 to trim the assist current source 694 to draws the desired current $-(dV_O/dt)*C_O$ in accordance with the teachings of the present invention.

Figure 7:
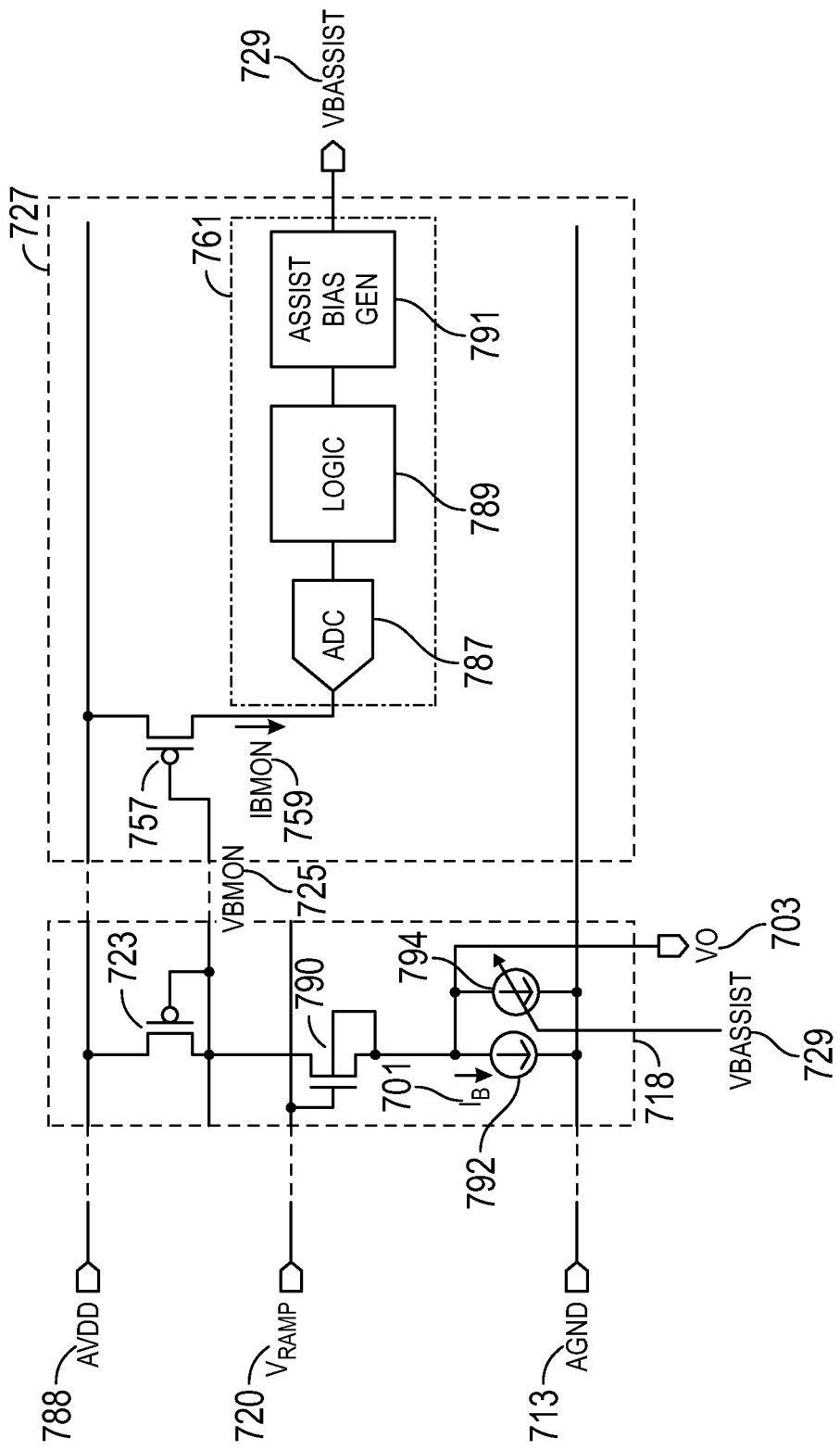
FIG. 7 shows a schematic of an example local ramp buffer circuit including ramp settling assist circuits with an example current monitor circuit and yet another example corner bias circuit to calibrate the ramp settling circuit in accordance with the teachings of the present invention.

FIG. 7 shows a schematic of an example local ramp buffer circuit including ramp settling assist circuits with an example current monitor circuit and yet another example corner bias circuit to calibrate the ramp settling circuit in accordance with the teachings of the present invention. It is appreciated that the local ramp buffer circuit, ramp settling circuit, current monitor circuit, and corner bias circuit illustrated in FIG. 7 may be another example of the local ramp buffer circuits, ramp settling circuits, current monitor circuit, and corner bias circuit illustrated in FIG. 5, or examples of local ramp buffer circuits, ramp settling circuits, current monitor circuit, and corner bias circuit illustrated in FIG. 3A, or examples of the local ramp buffer circuit illustrated in FIG. 2, and that similarly named and numbered elements described above are coupled and function similarly below. It is further appreciated that the local ramp buffer circuit, ramp settling circuit, current monitor circuit, and corner bias circuit illustrated in FIG. 7 shares many similarities with the local ramp buffer circuit, ramp settling circuit, current monitor circuit, and corner bias circuit illustrated in FIG. 6.

For instance, as shown in the example depicted in FIG. 7, a local ramp buffer circuit is included in a portion of an ADC 718. In the depicted example, ADC 718 includes current monitor circuit 723 coupled to power line 788 (e.g., AVDD). In the example, current monitor circuit 723 is illustrated as a transistor having a source coupled to the power line 788 and a gate and a drain that are coupled together to generate a current monitor signal VBMON 725 as shown. The local ramp buffer circuit includes an input device 790, which is shown as including a transistor having a gate coupled to receive the ramp signal $V_{RAMP}$ 720, a drain coupled to the power line 788 through current monitor circuit 723, and a source coupled to generate the output voltage $V_O$ 703 as shown. In the example, the output voltage $V_O$ 703 follows the ramp signal $V_{RAMP}$ 720.

In the depicted example, a bias current source 792 is coupled between input device 790 and ground AGND 713 to conduct a bias current $I_B$ 701. The depicted example also illustrates that an assist current source 794 is coupled between input device 790 and ground AGND 713. In the example, assist current source 794 is coupled to receive an assist bias voltage VBASSIST 729 from a corner bias circuit 727 to trim the assist current that is configured to be conducted from the output of respective input device 790 to ground AGND 713.

In the example depicted in FIG. 7, corner bias circuit 727 is illustrated as receiving the current monitor signal VBMON 725 from current monitor circuit 723 as shown. In the illustrated example, corner bias circuit 727 is illustrated as including a corner bias input device 757 having an input coupled to receive the current monitor signal VBMON 725. The example illustrated in FIG. 7 illustrates corner bias input device 757 as a transistor having a source coupled to power line 788, a gate coupled to receive the current monitor signal VBMON 725, and a drain coupled to generate a corner bias monitor current IBMON 759 in response to the current monitor signal VBMON 725.

In the example, a bias generator 761 is configured to generate the assist bias voltage VBASSIST 729 in response to the corner bias monitor current IBMON 759 received from corner bias input device 757. In the various examples, the assist bias voltage VBASSIST 729 generated by bias generator 761 of corner bias circuit 727 is configured to trim the assist current source 794 in accordance with the teachings of the present invention.

In the example depicted in FIG. 7, bias generator 761 includes an analog to digital converter 787 coupled to receive the corner bias monitor current IBMON 759 from the corner bias input device 757 to generate a digital representation of the corner bias monitor current IBMON 759. A logic circuit 789 is coupled to receive the digital representation of the corner bias monitor current IBMON 759 from the analog to digital converter 787. The logic circuit 789 is configured to generate a digital assist voltage bias setting signal in response to the digital representation of the corner bias monitor current IBMON 759. An assist bias voltage generator 791 is configured to generate the assist bias voltage VBASSIST 729 in response to digital assist voltage bias setting signal received from the logic circuit 789. In the example, the logic circuit 789 is configured to determine an ideal settling for the for the assist bias generator 791 based on the digital representation of the corner bias monitor current IBMON 759 from the analog to digital converter 787.

Figure 8:
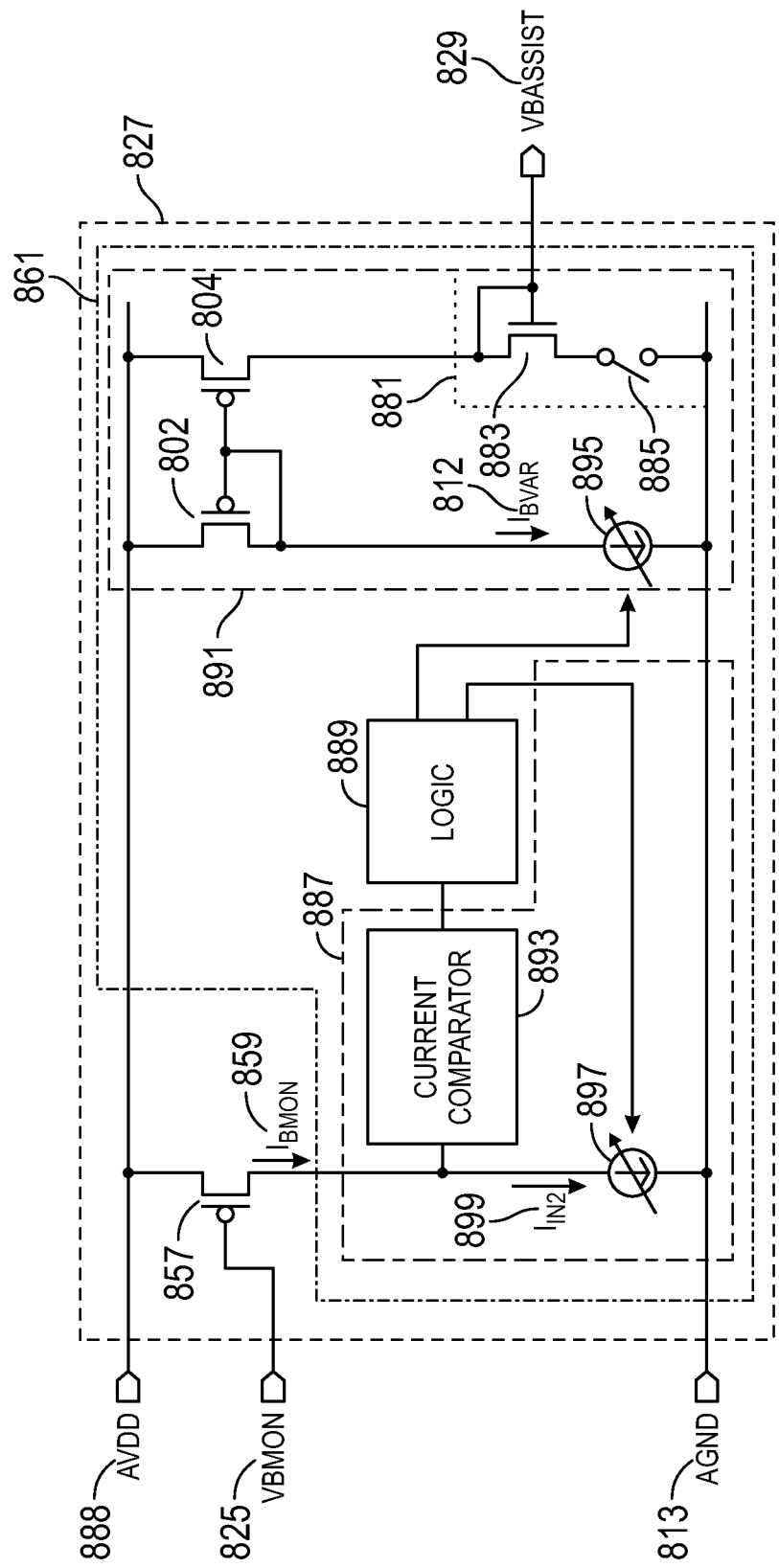
FIG. 8 shows a schematic of still another example corner bias circuit to calibrate a ramp settling circuit in accordance with the teachings of the present invention.

FIG. 8 shows a schematic of still another example corner bias circuit to calibrate a ramp settling circuit in accordance with the teachings of the present invention. It is appreciated that the corner bias circuit illustrated in FIG. 8 may be another example of the corner bias circuit illustrated in FIG. 7, and that similarly named and numbered elements described above are coupled and function similarly below.

In the depicted example, corner bias circuit 827 is illustrated as receiving the current monitor signal VBMON 825. In the illustrated example, corner bias circuit 827 is illustrated as including a corner bias input device 857 having an input coupled to receive the current monitor signal VBMON 825. The example illustrated in FIG. 8 illustrates corner bias input device 857 as a transistor having a source coupled to power line 888 (e.g., AVDD), a gate coupled to receive the current monitor signal VBMON 825, and a drain coupled to generate a corner bias monitor current IBMON 859 in response to the current monitor signal VBMON 825.

In the example, a bias generator 861 is configured to generate the assist bias voltage VBASSIST 829 in response to the corner bias monitor current IBMON 859 received from corner bias input device 857. In the various examples, the assist bias voltage VBASSIST 829 generated by bias generator 861 of corner bias circuit 827 is configured to trim an assist current source in accordance with the teachings of the present invention.

In the example depicted in FIG. 8, bias generator 861 includes an analog to digital converter 887 coupled to receive the corner bias monitor current IBMON 859 from the corner bias input device 857 to generate a digital representation of the corner bias monitor current IBMON 859. A logic circuit 889 is coupled to receive the digital representation of the corner bias monitor current IBMON 859 from the analog to digital converter 887. The logic circuit 889 is configured to generate a digital assist voltage bias setting signal in response to the digital representation of the corner bias monitor current IBMON 859. An assist bias voltage generator 891 is configured to generate the assist bias voltage VBASSIST 829 in response to digital assist voltage bias setting signal received from the logic circuit 889. In the example, the logic circuit 889 is configured to determine an ideal settling the for the assist bias generator 891 based on the digital representation of the corner bias monitor current IBMON 859 from the analog to digital converter 887.

In the example depicted in FIG. 8, the analog to digital converter 887 includes a first variable current source 897 coupled to draw a first variable current $I_{IN2}$ 899. In the example, the analog to digital converter 887 also includes a current comparator circuit 893 coupled to the corner bias input device 859 and the first variable current source 897. In operation, the logic circuit 889 is configured to control the first variable current source 897. In operation, the current comparator circuit 893 is configured to generate the digital representation of the corner bias monitor current IBMON 859 in response to the comparison of the first variable current conducted $I_{IN2}$ 899 through the first variable current source 897 and the corner bias monitor current IBMON 859 from the corner bias input device 857.

In the depicted example, the assist bias voltage generator 891 includes a second variable current source 895 coupled to the logic circuit 889. In operation, the second variable current source 895 is configured to conduct a second variable current $I_{BVAR}$ 812 in response the digital assist voltage bias setting signal from the logic circuit 889. As shown in the depicted example, the assist bias voltage generator 891 also includes a current mirror with a first current mirror transistor 802 coupled between the power line 888 and the second variable current source 895, and a second current mirror transistor 804 coupled to the power line 888. A gate of the second current mirror transistor 804 is coupled to a gate and a drain of the first current mirror transistor 802. In operation, the second variable current $I_{BVAR}$ 812 is conducted through the first current mirror transistor 802 and a mirrored second variable current is conducted through the second current mirror transistor 804. In the depicted example, a replica assist current source 881 is coupled to the second current mirror transistor 804 such that the mirrored second variable current is conducted through the replica assist current source 881.

In the illustrated example, the replica assist current source 881 includes a replica assist transistor 883 having a gate and drain that are coupled together and coupled to the second current mirror transistor 804. A replica assist switch 885 is coupled to the replica assist transistor 883 such that the replica assist transistor 883 and the replica assist switch 885 are coupled between the second current mirror transistor 804 and ground AGND 813. In the example, the assist bias voltage VBASSIST 829 is configured to be generated at the gate and drain of the replica assist transistor 883 as shown in response to the mirrored second variable current is conducted through the second current mirror transistor 804.

In one example, referring again to the timing diagram depicted in FIG. 3C, the logic circuit 889 controls first variable current source 897 to convert the corner bias monitor current IBMON 859 from the corner bias input device 857 to the digital number. To do that, the logic circuit 889 changes the first variable current $I_{IN2}$ 899 drawn by the first variable current source 897 step by step gradually. As the corner bias input device 857 generates the corner bias monitor current IBMON 859 and the first variable current source 897 draws the first variable current $I_{IN2}$ 899, the current difference of IBMON–$I_{IN2}$ is input to the current comparator 893 at time T2 during the ramp event. In operation, the current comparator is configured to evaluate the input current IBMON–$I_{IN2}$ and determine its output depending on the polarity of the input current. For example, the current comparator 893 may output a high value (e.g., "1") when IBMON 859 is greater than $I_{IN2}$ 899, and current comparator 893 may output low value (e.g., "0") when IBMON 859 is less than $I_{IN2}$ 899. The logic circuit 889 is configured to detect when the output of the current comparator 893 has flipped or changed to evaluate the value of IBMON 859. Based on the result, the logic circuit 889 is configured to control the second variable current source 895 to generate the assist bias voltage VBASSIST 829 in accordance with the teachings of the present invention.

Figure 9:
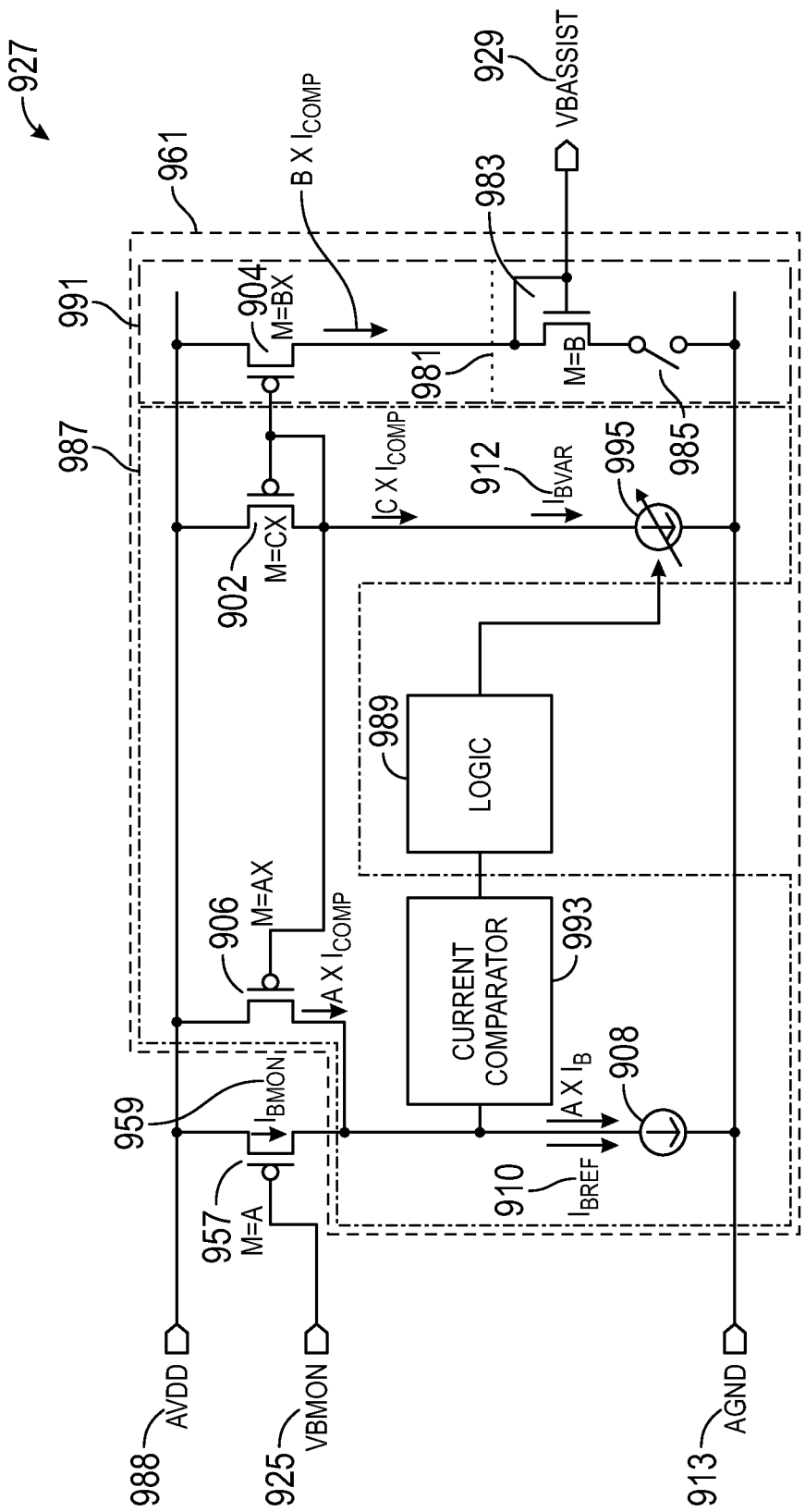
FIG. 9 shows a schematic of yet another example corner bias circuit to calibrate a ramp settling circuit in accordance with the teachings of the present invention.

FIG. 9 shows a schematic of yet another example corner bias circuit to calibrate a ramp settling circuit in accordance with the teachings of the present invention. It is appreciated that the corner bias circuit illustrated in FIG. 9 may be another example of the corner bias circuit illustrated in FIG. 7, and that similarly named and numbered elements described above are coupled and function similarly below.

In the depicted example, corner bias circuit 927 is illustrated as receiving the current monitor signal VBMON 925. In the illustrated example, corner bias circuit 927 is illustrated as including a corner bias input device 957 having an input coupled to receive the current monitor signal VBMON 925. The example illustrated in FIG. 9 illustrates corner bias input device 957 as a transistor having a source coupled to power line 988 (e.g., AVDD), a gate coupled to receive the current monitor signal VBMON 925, and a drain coupled to generate a corner bias monitor current IBMON 959 in response to the current monitor signal VBMON 925.

In the example, a bias generator 961 is configured to generate the assist bias voltage VBASSIST 929 in response to the corner bias monitor current IBMON 959 received from corner bias input device 957. In the various examples, the assist bias voltage VBASSIST 929 generated by bias generator 961 of corner bias circuit 927 is configured to trim an assist current source in accordance with the teachings of the present invention.

In the example depicted in FIG. 9, bias generator 961 includes an analog to digital converter 987 coupled to receive the corner bias monitor current IBMON 959 from the corner bias input device 957 to generate a digital representation of the corner bias monitor current IBMON 959. A logic circuit 989 is coupled to receive the digital representation of the corner bias monitor current IBMON 959 from the analog to digital converter 987. The logic circuit 989 is configured to generate a digital assist voltage bias setting signal in response to the digital representation of the corner bias monitor current IBMON 959. An assist bias voltage generator 991 is configured to generate the assist bias voltage VBASSIST 929 in response to digital assist voltage bias setting signal received from the logic circuit 989. In the example, the logic circuit 989 is configured to determine an ideal settling for the for the assist bias generator 991 based on the digital representation of the corner bias monitor current IBMON 959 from the analog to digital converter 987.

In the depicted example, the analog to digital converter 987 includes a reference current source 908 coupled to draw a reference current $I_{BREF}$ 910. The analog to digital converter 987 also includes a current comparator circuit 993 coupled to the corner bias input device 957, the reference current source 908, and the logic circuit 989. The analog to digital converter 987 further includes a variable current source circuit 995 that is coupled to receive a digital assist voltage bias setting signal from the logic circuit 989.

In the example, a current mirror circuit is shown including a first current mirror transistor 906 is coupled to the power line 988 and the current comparator circuit 993, a second current mirror transistor 902 is coupled to the power line 988, the variable current source circuit 995, and the first current mirror transistor 906, and a third current mirror transistor 904 coupled to the power line 988 as shown. A gate of the first current mirror transistor 906 and a gate of the third current mirror transistor 904 are coupled to a gate and drain of the second current mirror transistor 902.

In operation, the first current mirror transistor 906 is configured to provide the first variable current to the input of the current comparator circuit 993. The variable current source 995 is configured to generate a second variable current $I_{BVAR}$ 912 in response to the digital assist voltage bias setting signal from the logic circuit 989. In the example, the second variable current $I_{BVAR}$ 912 is conducted through the second current mirror transistor 902 and the first variable current provided by the first current mirror transistor 906 is therefore a mirrored second variable current $I_{BVAR}$ 912. Thus, the variable current source 995 is configured to generate the second variable current $I_{BVAR}$ 912 to control the first variable current that is provided from first current mirror transistor 906 to the input of the current comparator circuit 993.

In the depicted example, the assist bias voltage generator 991 includes the third current mirror transistor 904 that is coupled to the second current mirror transistor 902 as discussed above. As such, a third variable current that is conducted through the third current mirror transistor 904 is also a mirrored second variable current $I_{BVAR}$ 912. In the example, the assist bias voltage generator 991 also includes a replica assist current source 981 that is coupled to the third current mirror transistor 904 such that the third variable current that is conducted through the third current mirror transistor 904 is conducted through the replica assist current source 981.

In the illustrated example, the replica assist current source 981 includes a replica assist transistor 983 having a gate and drain that are coupled together and coupled to the third current mirror transistor 904. A replica assist switch 985 is coupled to the replica assist transistor 983 such that the replica assist transistor 983 and the replica assist switch 985 are coupled between the third current mirror transistor 904 and ground AGND 913. In the example, the assist bias voltage VBASSIST 929 is configured to be generated at the gate and drain of the replica assist transistor 983 as shown in response to the third variable current that is conducted through the third current mirror transistor 904.

In one example, it is assumed that the width of the transistor of corner bias input device 957 is m=a, the width of first current mirror transistor 906 is m=ax, the width of second current mirror transistor 902 is m=cx, the width of replica assist transistor 983 is m=b, and the width of the transistor of third current mirror transistor 904 is m=bx. As such, it can be assumed that the first variable current through first current mirror transistor 906 is $a*I_{COMP}$, the second variable current from second current mirror transistor 902 is $c*I_{COMP}$, the third variable current through the third current mirror transistor 904 is $c*I_{COMP}$, and that the reference current source 908 is designed to draw bias current $a*I_B$.

Thus, during operation, it is appreciated that the logic circuit 989 controls the second variable current $I_{BVAR}$ 912 generated by the variable current source 995, which is connected to ground AGND 913. The second variable current $I_{BVAR}$ 912 current from the variable current source 995 $c*I_{COMP}$ is mirrored and outputs the first variable current $a*I_{COMP}$ through first current mirror transistor 906 to the input of the current comparator circuit 993. The reference current $I_{BREF}$ 910 generated by reference current source 908 is coupled to the input of the current comparator circuit 993 is configured to draw current $a*I_B$. During the calibration that occurs at time T2 in FIG. 3C, the corner bias current IBMON 959 generated by the corner bias input device 957 $I_{IN}$ is $a*\{I_B-(-dV_O/dt)*C_O\}$ so that the input current to the current comparator becomes $a*\{I_{COMP}-(-dV_O/dt)*C_O\}$. During this period, the logic circuit 989 is configured to change the second variable current $I_{BVAR}$ 912 generated by the variable current source 995 to find $I_{COMP}$ close to $(-dV_O/dt)*C_O$. After the calibration, the logic circuit 989 stores the setting at which the current comparator circuit 993 is flipped and the second variable current TB VAR 912 generated by the variable current source 995 is closest to $c*(-dV_O/dt)*C_O$, which is mirrored to the third variable current through third current mirror transistor 904 in bias generator 991 to provide the bias voltage VBASSIST 929 in accordance with the teachings of the present invention.

Figure 10:
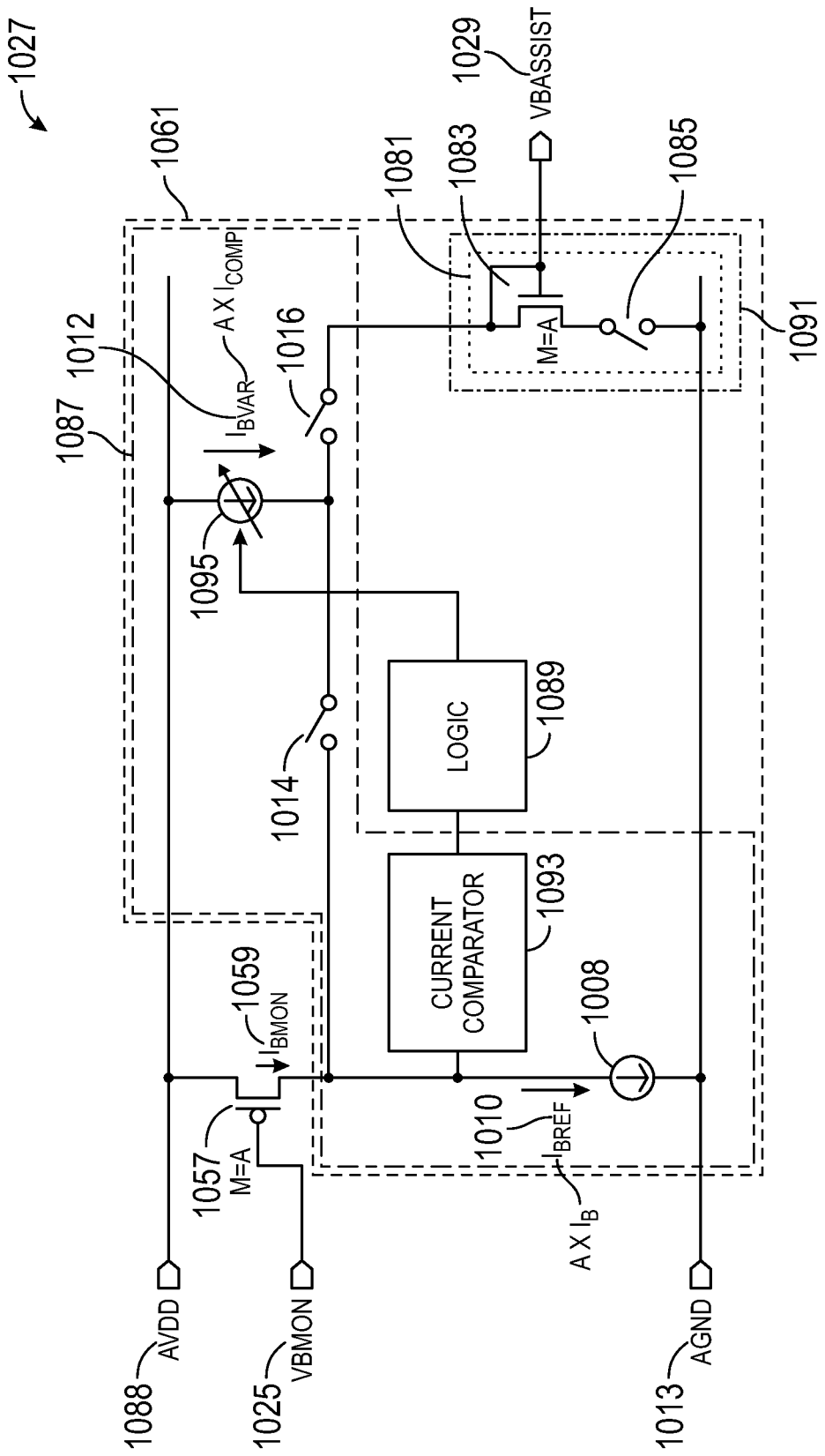
FIG. 10 shows a schematic of still another example corner bias circuit to calibrate a ramp settling circuit in accordance with the teachings of the present invention.

FIG. 10 shows a schematic of still another example corner bias circuit to calibrate a ramp settling circuit in accordance with the teachings of the present invention. It is appreciated that the corner bias circuit illustrated in FIG. 10 may be another example of the corner bias circuit illustrated in FIG. 7, and that similarly named and numbered elements described above are coupled and function similarly below.

In the depicted example, corner bias circuit 1027 is illustrated as receiving the current monitor signal VBMON 1025. In the illustrated example, corner bias circuit 1027 is illustrated as including a corner bias input device 1057 having an input coupled to receive the current monitor signal VBMON 1025. The example illustrated in FIG. 10 illustrates corner bias input device 1057 as a transistor having a source coupled to power line 1088 (e.g., AVDD), a gate coupled to receive the current monitor signal VBMON 1025, and a drain coupled to generate a corner bias monitor current IBMON 1059 in response to the current monitor signal VBMON 1025.

In the example, a bias generator 1061 is configured to generate the assist bias voltage VBASSIST 1029 in response to the corner bias monitor current IBMON 1059 received from corner bias input device 1057. In the various examples, the assist bias voltage VBASSIST 1029 generated by bias generator 1061 of corner bias circuit 1027 is configured to trim an assist current source in accordance with the teachings of the present invention.

In the example depicted in FIG. 10, bias generator 1061 includes an analog to digital converter 1087 coupled to receive the corner bias monitor current IBMON 1059 from the corner bias input device 1057 to generate a digital representation of the corner bias monitor current IBMON 1059. A logic circuit 1089 is coupled to receive the digital representation of the corner bias monitor current IBMON 1059 from the analog to digital converter 1087. The logic circuit 1089 is configured to generate a digital assist voltage bias setting signal in response to the digital representation of the corner bias monitor current IBMON 1059. An assist bias voltage generator 1091 is configured to generate the assist bias voltage VBASSIST 1029 in response to digital assist voltage bias setting signal received from the logic circuit 1089. In the example, the logic circuit 1089 is configured to determine an ideal setting for the for the assist bias generator 1091 based on the digital representation of the corner bias monitor current IBMON 1059 from the analog to digital converter 1087.

In the depicted example, the analog to digital converter 1087 includes a reference current source 1008 coupled to draw a reference current $I_{BREF}$ 1010. The analog to digital converter 1087 also includes a current comparator circuit 1093 coupled to the corner bias input device 1057, and the logic circuit 1089. The analog to digital converter 1087 further includes a variable current source circuit 1095 that is coupled to the power line 1088 and is coupled to receive a digital assist voltage bias setting signal from the logic circuit 1089 to provide a variable current $I_{BVAR}$ 1012 in response. As shown in the depicted example, a first switch 1014 is coupled between the variable current source 1095 and the input of the current comparator circuit 1093. As such, the variable current source 1095 and the first switch 1014 are coupled between the power line 1088 and the input of the current comparator circuit 1093. A second switch 1016 is coupled between the variable current source 1012 and the assist bias voltage generator 1091.

In operation, the first switch 1014 is configured to be on and the second switch 1016 is configured to be off during a calibration operation. In operation, a first variable current is configured to be provided from the variable current source 1012 to the input of the current comparator circuit through the first switch 1014 with the corner bias monitor current IBMON 1059 from the corner bias input device 1057 during the calibration operation. The first switch 1014 is configured to be off and the second switch 1016 is configured to be on after the calibration operation is complete. As such, a second variable current is configured to be provided from the variable current source 1095 to the assist bias voltage generator 1091 through the second switch 1016 after the calibration operation is complete.

In the depicted example, the assist bias voltage generator 1091 includes a replica assist current source 1081 that is coupled to receive the second variable current provided from the variable current source 1095 through the second switch 1016 after the calibration operation is complete. In the illustrated example, the replica assist current source 1081 includes a replica assist transistor 1083 having a gate and drain that are coupled together and coupled to the second switch 1016. A replica assist switch 1085 is coupled to the replica assist transistor 1083 such that the replica assist transistor 1083 and the replica assist switch 1085 are coupled between the second switch 1016 and ground AGND 1013. In the example, the assist bias voltage VBASSIST 1029 is configured to be generated at the gate and drain of the replica assist transistor 1083 as shown in response to the second variable current provided from the variable current source 1095 through the second switch 1016.

In one example, it is assumed that the width of replica assist transistor 1083 is m=a, the reference current $I_{BREF}$ 1010 through reference current source 1008 is a*$I_B$. During calibration, the first switch 1014 is on (e.g., closed) and the second switch 1016 is off (e.g., open) and logic 1089 changes a control signal to sweep the variable current $I_{BVAR}$ so that the first variable current provided by $I_{BVAR}$ 1012 is coupled with the to the input of current comparator circuit 1093 with corner bias monitor current IBMON 1059 from the analog to digital converter 1087 to find the optimum value of the assist current $I_{ASSIST}$. After calibration is finished and the value for $I_{BVAR}$ 1012 is therefore set to a*$I_{COMP}$, which is closest to a*(-$dV_O$/dt)*$C_O$, the first switch 1014 is then turned off (e.g., opened) and the second switch 1016 is turned on (e.g., closed) so that the current a*$I_{COMP}$ is provided to the bias generator 1091 to generate the assist bias voltage VBASSIST 1029 in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A ramp buffer circuit, comprising:
   a ramp buffer input device having an input coupled to receive a ramp signal;
   a current monitor circuit coupled to a power line and the ramp buffer input device, wherein the current monitor circuit is configured to generate a current monitor signal in response to an input current conducted through the ramp buffer input device;
   a corner bias circuit coupled to the current monitor circuit, wherein the corner bias circuit is configured to generate an assist bias voltage in response to the current monitor signal received from the current monitor circuit;

a bias current source coupled to an output of the ramp buffer input device, wherein the ramp buffer input device and the bias current source are coupled between a power line and ground;

an assist current source coupled to the corner bias circuit and coupled between the output of the ramp buffer input device and ground, wherein the assist current source is configured to conduct an assist current from the output of the ramp buffer input device to ground in response to the assist bias voltage received from the corner bias circuit.

2. The ramp buffer circuit of claim 1, wherein the current monitor circuit comprises a current monitor transistor having a source coupled to the power line and a gate and a drain coupled to the ramp buffer input device, wherein the current monitor circuit is configured to generate the current monitor signal at the gate of the current monitor transistor.

3. The ramp buffer circuit of claim 1, wherein the assist current source comprises an assist current transistor coupled between the output of the ramp buffer input device and ground, wherein the assist current transistor includes a gate coupled to receive the assist bias voltage from the corner bias circuit.

4. The ramp buffer circuit of claim 3, wherein the assist current source further comprises:
a sample and hold capacitor coupled to the gate of the assist current transistor to hold the assist bias voltage received from the corner bias circuit; and
a sample and hold switch coupled to the sample and hold capacitor, wherein the sample and hold switch is configured to sample the assist bias voltage received from the corner bias circuit onto the sample and hold capacitor.

5. The ramp buffer circuit of claim 1, wherein the corner bias circuit comprises:
a corner bias input device having an input coupled to receive the current monitor signal from the current monitor circuit, wherein the corner bias input device is configured to generate a corner bias monitor current in response to the current monitor signal from the current monitor circuit; and
a bias generator circuit coupled to the corner bias input device to receive the corner bias monitor current, wherein the bias generator is configured to generate the assist bias voltage in response to the corner bias monitor current received from the corner bias input device.

6. The ramp buffer circuit of claim 5, wherein the bias generator circuit comprises:
a first bias generator current source coupled to the corner bias input device, wherein the corner bias input device and the first bias generator current source are coupled between the power line and ground;
a current to voltage converter coupled to the corner bias input device and the first bias generator current source;
a second bias generator current source coupled to the current to voltage converter; and
a replica assist current source coupled to the second bias generator current source.

7. The ramp buffer circuit of claim 6, wherein the first bias generator current source comprises:
a first bias generator transistor coupled between the corner bias input device and ground;
a first bias generator switch coupled between the corner bias input device and a gate of the first bias generator transistor; and
a first bias generator capacitor coupled between the gate of the first bias generator transistor and ground.

8. The ramp buffer circuit of claim 6, wherein the current to voltage converter comprises:
a current to voltage transistor coupled to the power line; and
a current to voltage switch coupled between the current to voltage transistor and the first bias generator current source, wherein a gate and a drain of the current to voltage transistor are coupled to the current to voltage switch, wherein an output voltage of the current to voltage converter is generated at the gate and drain of the current to voltage transistor.

9. The ramp buffer circuit of claim 6, wherein the second bias generator current source comprises:
a sample and hold circuit coupled to receive an output voltage from the current to voltage converter; and
a second bias generator transistor coupled to the power line, wherein a gate of the second bias generator transistor is coupled to the sample and hold circuit to receive the output voltage sampled and held from the current to voltage converter.

10. The ramp buffer circuit of claim 6, wherein the replica assist current source comprises:
replica assist transistor having a gate and drain that are coupled together; and
a replica assist switch coupled to the replica assist transistor, wherein the replica assist transistor and the replica assist switch are coupled between the second bias generator current source and ground, wherein the assist bias voltage is configured to be generated at the gate and drain of the replica assist transistor.

11. The ramp buffer circuit of claim 5, wherein the bias generator circuit comprises:
an analog to digital converter coupled to receive the corner bias monitor current from the corner bias input device to generate a digital representation of the corner bias monitor current;
a logic circuit coupled to receive the digital representation of the corner bias monitor current from the analog to digital converter, wherein the logic circuit is configured to generate a digital assist voltage bias setting signal in response to the digital representation of the corner bias monitor current; and
an assist bias voltage generator configured to generate the assist bias voltage in response to digital assist voltage bias setting signal.

12. The ramp buffer circuit of claim 11, wherein the analog to digital converter comprises:
a first variable current source coupled to draw a first variable current; and
a current comparator circuit coupled to the corner bias input device and the first variable current source, wherein the current comparator circuit is configured to control the first variable current source in response to a comparison of the first variable current conducted through the first variable current source and the corner bias monitor current, wherein the current comparator circuit is configured to generate the digital representation of the corner bias monitor current in response to the comparison of the first variable current conducted through the first variable current source and the corner bias monitor current.

13. The ramp buffer circuit of claim 11, wherein the assist bias voltage generator comprises:
a second variable current source coupled to the logic circuit, wherein the second variable current source is configured to conduct a second variable current in response the digital assist voltage bias setting signal from the logic circuit;

a first current mirror transistor coupled between the power line and the second variable current source, wherein the second variable current is conducted through the first current mirror transistor;

a second current mirror transistor coupled to the power line, wherein a gate of the second current mirror transistor is coupled to a gate and a drain of the first current mirror transistor, wherein a mirrored second variable current is conducted through the second current mirror transistor; and a replica assist current source coupled to the second current mirror transistor.

14. The ramp buffer circuit of claim 13, wherein the replica assist current source comprises:

replica assist transistor having a gate and drain that are coupled together; and a replica assist switch coupled to the replica assist transistor, wherein the replica assist transistor and the replica assist switch are coupled between the second current mirror transistor and ground, wherein the assist bias voltage is configured to be generated at the gate and drain of the replica assist transistor.

15. The ramp buffer circuit of claim 11, wherein the analog to digital converter comprises:

a reference current source coupled to draw a reference current;

a current comparator circuit coupled to the corner bias input device, the reference current source, and the logic circuit; and a variable current source circuit coupled to receive the digital assist voltage bias setting signal from the logic circuit, wherein the logic circuit is configured to control the variable current source circuit to control a first variable current that is configured to be provided to an input of the current comparator circuit in response to a comparison of the corner bias monitor current and the first variable current with the reference current by the current comparator.

16. The ramp buffer circuit of claim 15, wherein the analog to digital converter further comprises:

a first current mirror transistor coupled to the power line and the current comparator circuit, wherein the first current mirror transistor is configured to provide the first variable current to the input of the current comparator circuit; and a second current mirror transistor coupled to the power line, the variable current source circuit, and the first current mirror transistor, wherein a gate of the first current mirror transistor is coupled to a gate and a drain of the second current mirror transistor, wherein the second current mirror transistor and the variable current source circuit are coupled between the power line and ground, wherein a second variable current is configured to be conducted through the second current mirror transistor and the variable current source circuit.

17. The ramp buffer circuit of claim 16, wherein the assist bias voltage generator comprises:

a third current mirror transistor coupled to the power line, wherein a gate of the third current mirror transistor is coupled to the gate and the drain of the second current mirror transistor, wherein the third current mirror transistor is configured to provide a third variable current; and a replica assist current source coupled to the third current mirror transistor.

18. The ramp buffer circuit of claim 17, wherein the replica assist current source comprises:

replica assist transistor having a gate and drain that are coupled together; and a replica assist switch coupled to the replica assist transistor, wherein the replica assist transistor and the replica assist switch are coupled between the third current mirror transistor and ground, wherein the assist bias voltage is configured to be generated at the gate and drain of the replica assist transistor.

19. The ramp buffer circuit of claim 15, wherein the analog to digital converter further comprises:

a first switch coupled between the variable current source circuit and the input of the current comparator circuit, wherein the variable current source circuit and the first switch are coupled between the power line and the input of the current comparator circuit; and a second switch coupled between the variable current source circuit and the assist bias voltage generator, wherein the first switch is configured to be on and the second switch is configured to be off during a calibration operation, wherein the first variable current is configured to be provided from the variable current source circuit to the input of the current comparator circuit through the first switch during the calibration operation, wherein the first switch is configured to be off and the second switch is configured to be on after the calibration operation is complete, wherein a second variable current is configured to be provided from the variable current source circuit to the assist bias voltage generator through the second switch after the calibration operation is complete.

20. The ramp buffer circuit of claim 19, wherein the assist bias voltage generator comprises a replica assist current source coupled to the second switch.

21. The ramp buffer circuit of claim 20, wherein the replica assist current source comprises:

replica assist transistor having a gate and drain that are coupled together; and a replica assist switch coupled to the replica assist transistor, wherein the replica assist transistor and the replica assist switch are coupled between the second switch and ground, wherein the assist bias voltage is configured to be generated at the gate and drain of the replica assist transistor.

22. An imaging system, comprising:

an array of pixels to receive image light and generate an image charge voltage signal in response; and readout circuitry coupled to receive the image charge voltage signal from the array of pixels and provide a digital representation of the image charge voltage signal in response, the readout circuitry including a comparator to receive the image charge voltage signal, compare the image charge voltage signals to a ramp signal from a ramp generator, and provide the digital representation of the image charge voltage signal in response, wherein the comparator is coupled to receive the ramp signal through a ramp buffer circuit, wherein the ramp buffer circuit comprises:

a ramp buffer input device having an input coupled to receive the ramp signal;

a current monitor circuit coupled to a power line and the ramp buffer input device, wherein the current monitor circuit is configured to generate a current monitor signal in response to an input current conducted through the ramp buffer input device;
a corner bias circuit coupled to the current monitor circuit, wherein the corner bias circuit is configured to generate an assist bias voltage in response to the current monitor signal received from the current monitor circuit;
a bias current source coupled to an output of the ramp buffer input device, wherein the ramp buffer input device and the bias current source are coupled between a power line and ground;
an assist current source coupled to the corner bias circuit and coupled between the output of the ramp buffer input device and ground, wherein the assist current source is configured to conduct an assist current from the output of the ramp buffer input device to ground in response to the assist bias voltage received from the corner bias circuit.

23. The imaging system of claim 22, wherein the current monitor circuit comprises a current monitor transistor having a source coupled to the power line and a gate and a drain coupled to the ramp buffer input device, wherein the current monitor circuit is configured to generate the current monitor signal at the gate of the current monitor transistor.

24. The imaging system of claim 22, wherein the assist current source comprises an assist current transistor coupled between the output of the ramp buffer input device and ground, wherein the assist current transistor includes a gate coupled to receive the assist bias voltage from the corner bias circuit.

25. The imaging system of claim 24, wherein the assist current source further comprises:
a sample and hold capacitor coupled to the gate of the assist current transistor to hold the assist bias voltage received from the corner bias circuit; and
a sample and hold switch coupled to the sample and hold capacitor, wherein the sample and hold switch is configured to sample the assist bias voltage received from the corner bias circuit onto the sample and hold capacitor.

26. The imaging system of claim 22, wherein the corner bias circuit comprises:
a corner bias input device having an input coupled to receive the current monitor signal from the current monitor circuit, wherein the corner bias input device is configured to generate a corner bias monitor current in response to the current monitor signal from the current monitor circuit; and
a bias generator circuit coupled to the corner bias input device to receive the corner bias monitor current, wherein the bias generator is configured to generate the assist bias voltage in response to the corner bias monitor current received from the corner bias input device.

27. The imaging system of claim 26, wherein the bias generator circuit comprises:
a first bias generator current source coupled to the corner bias input device, wherein the corner bias input device and the first bias generator current source are coupled between the power line and ground;
a current to voltage converter coupled to the corner bias input device and the first bias generator current source;
a second bias generator current source coupled to the current to voltage converter; and
a replica assist current source coupled to the second bias generator current source.

28. The imaging system of claim 27, wherein the first bias generator current source comprises:

a first bias generator transistor coupled between the corner bias input device and ground;
a first bias generator switch coupled between the corner bias input device and a gate of the first bias generator transistor; and
a first bias generator capacitor coupled between the gate of the first bias generator transistor and ground.

29. The imaging system of claim 27, wherein the current to voltage converter comprises:
a current to voltage transistor coupled to the power line; and
a current to voltage switch coupled between the current to voltage transistor and the first bias generator current source, wherein a gate and a drain of the current to voltage transistor are coupled to the current to voltage switch, wherein an output voltage of the current to voltage converter is generate at the gate and drain of the current to voltage transistor.

30. The imaging system of claim 27, wherein the second bias generator current source comprises:
a sample and hold circuit coupled to receive an output voltage from the current to voltage converter; and
a second bias generator transistor coupled to the power line, wherein a gate of the second bias generator transistor is coupled to the sample and hold circuit to receive the output voltage sampled and held from the current to voltage converter.

31. The imaging system of claim 27, wherein the replica assist current source comprises:
replica assist transistor having a gate and drain that are coupled together; and
a replica assist switch coupled to the replica assist transistor, wherein the replica assist transistor and the replica assist switch are coupled between the second bias generator current source and ground, wherein the assist bias voltage is configured to be generated at the gate and drain of the replica assist transistor.

32. The imaging system of claim 26, wherein the bias generator circuit comprises:
an analog to digital converter coupled to receive the corner bias monitor current from the corner bias input device to generate a digital representation of the corner bias monitor current;
a logic circuit coupled to receive the digital representation of the corner bias monitor current from the analog to digital converter, wherein the logic circuit is configured to generate a digital assist voltage bias setting signal in response to the digital representation of the corner bias monitor current; and
an assist bias voltage generator configured to generate the assist bias voltage in response to digital assist voltage bias setting signal.

33. The imaging system of claim 32, wherein the analog to digital converter comprises:
a first variable current source coupled to draw a first variable current; and
a current comparator circuit coupled to the corner bias input device and the first variable current source, wherein the current comparator circuit is configured to control the first variable current source in response to a comparison of the first variable current conducted through the first variable current source and the corner bias monitor current, wherein the current comparator circuit is configured to generate the digital representation of the corner bias monitor current in response to the comparison of the first variable current conducted through the first variable current source and the corner bias monitor current.

34. The imaging system of claim 32, wherein the assist bias voltage generator comprises:
a second variable current source coupled to the logic circuit, wherein the second variable current source is configured to conduct a second variable current in response the digital assist voltage bias setting signal from the logic circuit;
a first current mirror transistor coupled between the power line and the second variable current source, wherein the second variable current is conducted through the first current mirror transistor;
a second current mirror transistor coupled to the power line, wherein a gate of the second current mirror transistor is coupled to a gate and a drain of the first current mirror transistor, wherein a mirrored second variable current is conducted through the second current mirror transistor; and
a replica assist current source coupled to the second current mirror transistor.

35. The imaging system of claim 34, wherein the replica assist current source comprises:
replica assist transistor having a gate and drain that are coupled together; and
a replica assist switch coupled to the replica assist transistor, wherein the replica assist transistor and the replica assist switch are coupled between the second current mirror transistor and ground, wherein the assist bias voltage is configured to be generated at the gate and drain of the replica assist transistor.

36. The imaging system of claim 32, wherein the analog to digital converter comprises:
a reference current source coupled to draw a reference current;
a current comparator circuit coupled to the corner bias input device, the reference current source, and the logic circuit;
a variable current source circuit coupled to receive the digital assist voltage bias setting signal from the logic circuit, wherein the variable current source circuit is configured to control a first variable current that is configured to be provided to an input of the current comparator circuit in response to a comparison of the corner bias monitor current and the first variable current with the reference current by the current comparator.

37. The imaging system of claim 36, wherein the analog to digital converter further comprises:
a first current mirror transistor coupled to the power line and the current comparator circuit, wherein the first current mirror transistor is configured to provide the first variable current to the input of the current comparator circuit; and
a second current mirror transistor coupled to the power line, the variable current source circuit, and the first current mirror transistor, wherein a gate of the first current mirror transistor is coupled to a gate and a drain of the second current mirror transistor, wherein the second current mirror transistor and the variable current source circuit are coupled between the power line and ground, wherein a second variable current is configured to be conducted through the second current mirror transistor and the variable current source circuit.

38. The imaging system of claim 37, wherein the assist bias voltage generator comprises:
a third current mirror transistor coupled to the power line, wherein a gate of the third current mirror transistor is coupled to the gate and the drain of the second current mirror transistor, wherein the third current mirror transistor is configured to provide a third variable current; and
a replica assist current source coupled to the third current mirror transistor.

39. The imaging system of claim 38, wherein the replica assist current source comprises:
replica assist transistor having a gate and drain that are coupled together; and
a replica assist switch coupled to the replica assist transistor, wherein the replica assist transistor and the replica assist switch are coupled between the third current mirror transistor and ground, wherein the assist bias voltage is configured to be generated at the gate and drain of the replica assist transistor.

40. The imaging system of claim 36, wherein the analog to digital converter further comprises:
a first switch coupled between the variable current source circuit and the input of the current comparator circuit, wherein the variable current source circuit and the first switch are coupled between the power line and the input of the current comparator circuit; and
a second switch coupled between the variable current source circuit and the assist bias voltage generator,
wherein the first switch is configured to be on and the second switch is configured to be off during a calibration operation, wherein the first variable current is configured to be provided from the variable current source circuit to the input of the current comparator circuit through the first switch during the calibration operation,
wherein the first switch is configured to be off and the second switch is configured to be on after the calibration operation is complete, wherein a second variable current is configured to be provided from the variable current source circuit to the assist bias voltage generator through the second switch after the calibration operation is complete.

41. The ramp buffer circuit of claim 40, wherein the assist bias voltage generator comprises a replica assist current source coupled to the second switch.

42. The ramp buffer circuit of claim 41, wherein the replica assist current source comprises:
replica assist transistor having a gate and drain that are coupled together; and
a replica assist switch coupled to the replica assist transistor, wherein the replica assist transistor and the replica assist switch are coupled between the second switch and ground, wherein the assist bias voltage is configured to be generated at the gate and drain of the replica assist transistor.

* * * * *